(12) United States Patent
Okamura et al.

(10) Patent No.: US 8,188,637 B2
(45) Date of Patent: May 29, 2012

(54) LAMINATED PIEZOELECTRIC ELEMENT WITH POROUS SECTIONS

(75) Inventors: Takeshi Okamura, Kirishima (JP); Ichitaro Okamura, Kawachinagano (JP)

(73) Assignee: Kyocera Corporation, Kyoto (JP)

( * ) Notice: Subject to any disclaimer, the term of this patent is extended or adjusted under 35 U.S.C. 154(b) by 425 days.

(21) Appl. No.: 12/483,592

(22) Filed: Jun. 12, 2009

(65) Prior Publication Data

US 2009/0289130 A1 Nov. 26, 2009

Related U.S. Application Data

(63) Continuation-in-part of application No. PCT/JP2007/074171, filed on Dec. 14, 2007.

(30) Foreign Application Priority Data

Dec. 15, 2006 (JP) .................................. 2006-338355

(51) Int. Cl.
*H01L 41/083* (2006.01)
*H01L 41/04* (2006.01)

(52) U.S. Cl. ......... 310/328; 310/364; 310/365; 310/366

(58) Field of Classification Search .................. 310/328, 310/365–366
See application file for complete search history.

(56) References Cited

U.S. PATENT DOCUMENTS

| | | | |
|---|---|---|---|
| 6,765,337 B1 * | 7/2004 | Heinz et al. .................. | 310/328 |
| 7,420,319 B2 * | 9/2008 | Kastl et al. ..................... | 310/363 |
| 7,509,716 B2 * | 3/2009 | Omura et al. ................ | 29/25.35 |
| 7,545,080 B2 * | 6/2009 | Kastl et al. ..................... | 310/328 |
| 7,745,981 B2 * | 6/2010 | Omura et al. ................ | 310/366 |
| 2002/0149297 A1 * | 10/2002 | Yamamoto et al. ........... | 310/328 |
| 2007/0084034 A1 * | 4/2007 | Omura et al. ................ | 29/25.35 |

FOREIGN PATENT DOCUMENTS

| | | |
|---|---|---|
| JP | 07-030165 | 1/1995 |
| JP | 07030165 A * | 1/1995 |
| JP | 08-274381 | 10/1996 |
| JP | 2001-094164 | 4/2001 |
| JP | 2001-267646 | 9/2001 |
| JP | 2004-200382 | 7/2004 |
| JP | 2007157849 A * | 6/2007 |

OTHER PUBLICATIONS

English Translation of the Office Action issued in counterpart Chinese Patent Application No. 2007800460003.
International Search Report and Written Opinion dated Jan. 22, 2008 issued by the Japanese Patent Office for International Application No. PCT/JP2007/074141.

* cited by examiner

*Primary Examiner* — Jaydi San Martin
(74) *Attorney, Agent, or Firm* — Procopio, Cory, Hargreaves & Savitch LLP

(57) ABSTRACT

A laminated piezoelectric element having a laminated structure in which a plurality of piezoelectric layers and a plurality of internal electrodes are alternately laminated is provided. This laminated structure has an opposing section wherein an internal electrode on an anode side and an internal electrode on a cathode side which are adjacent to each other in the laminating direction, oppose in the laminating direction, and an end-side non-opposing section situated in a position closer to end in the laminating direction than the opposing section. This end-side non-opposing section has a porous section having porosity larger than that of the internal electrodes.

19 Claims, 20 Drawing Sheets

LAMINATED PIEZOELECTRIC ELEMENT WITH POROUS SECTIONS

RELATED APPLICATION

This application is a continuation-in-part of international patent application serial number PCT/JP2007/074171 filed on Dec. 14, 2007, which claims priority to Japanese Patent Application No. 2006-338355, filed Dec. 15, 2006, and the contents of each are incorporated herein by reference in their entirety.

FIELD OF THE INVENTION

The present invention relates to a laminated piezoelectric element, a jetting device, and a fuel jetting system.

BACKGROUND

Recently, for laminated piezoelectric elements, in addition to advance of miniaturization, it is requested to obtain stable displacement characteristic even in the case of long-time continuous driving under such severe conditions as high electric field and high pressure. A laminated piezoelectric element has an opposing section where internal electrodes on an anode side and on a cathode side oppose via a piezoelectric layer in the laminating direction, and a non-opposing section which is a portion other than the opposing section. In such a laminated piezoelectric element, since the non-opposing section does not displace while the opposing section displaces during driving, stress tends to be concentrated in this non-opposing section.

For alleviating such stress, for example, there are proposed a laminated piezoelectric element wherein electrode-electrode distance can be varied, a laminated piezoelectric element wherein an overlapping area of internal electrodes near the piezoelectric layer where is piezoelectrically inactive is made smaller than an overlapping area of internal electrodes in other piezoelectrically active part, and a laminated piezoelectric element wherein a site where stress tends to concentrate is provided with a stress alleviating layer filled with lead titanate power.

The conventional laminated piezoelectric elements as described above have stress alleviating effect in non-opposing sections. However, there is a need of a laminated piezoelectric element capable of obtaining more stable displacement characteristic even when it is continuously driven for a long time under severe condition.

SUMMARY

The laminated piezoelectric element of the present invention has a laminated structure in which a plurality of piezoelectric layers and a plurality of internal electrodes are alternately laminated. This laminated structure has an opposing section wherein an internal electrode on an anode side and an internal electrode on a cathode side which are adjacent to each other in the laminating direction, oppose in the laminating direction, and an end-side non-opposing section situated in a position closer to end in the laminating direction than the opposing section. This end-side non-opposing section has a porous section having porosity larger than that of the internal electrodes.

DETAILED DESCRIPTION

In the following, a laminated piezoelectric element (hereinafter, referred to as "element") according to one embodiment of the present invention will be explained in detail with reference to the drawings.

First Embodiment

Figure 1:
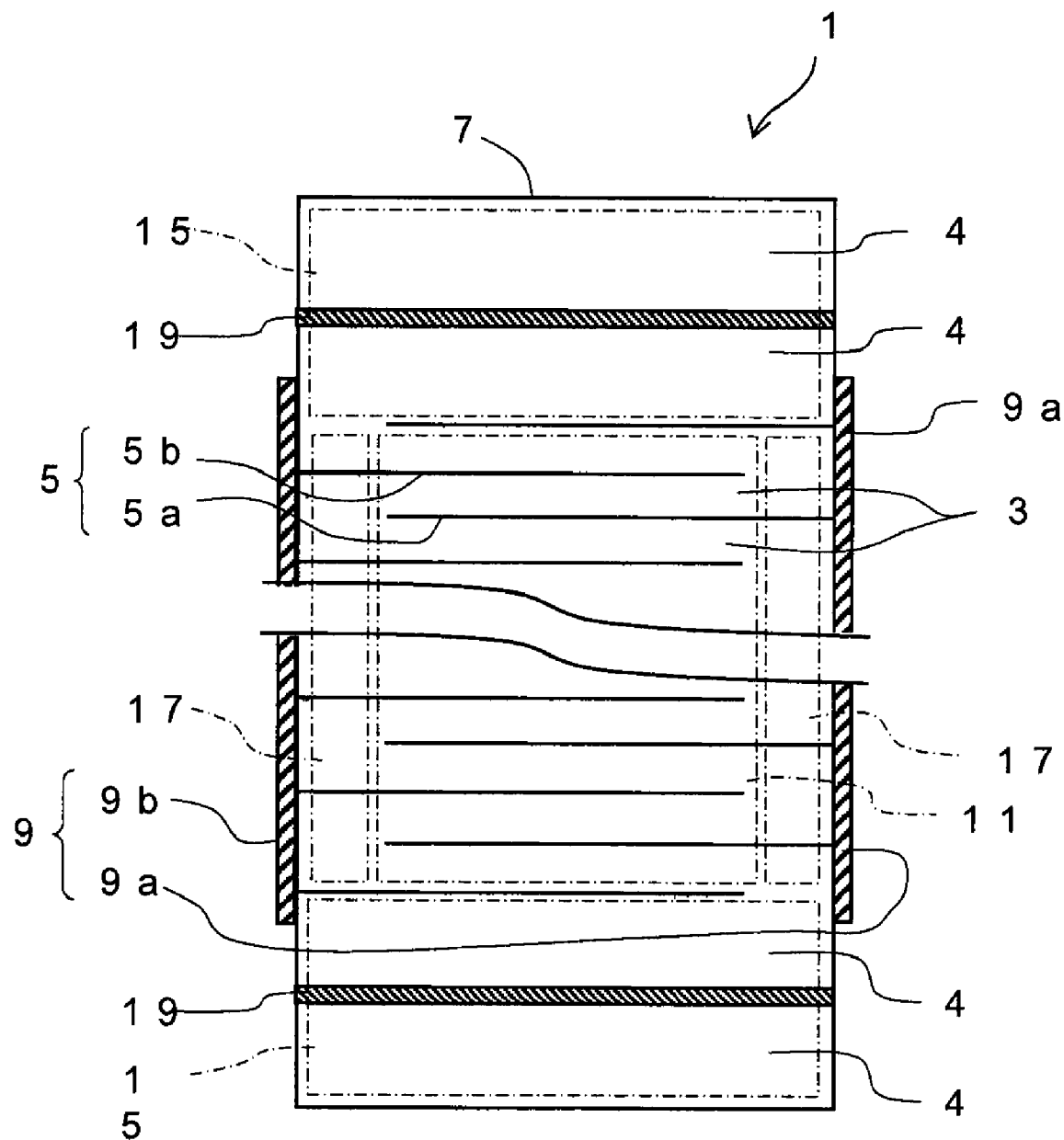
FIG. 1 illustrates a section view of a laminated piezoelectric element according to a first embodiment of the present invention.

As shown in FIG. 1, an element 1 according to the present embodiment has a laminated structure 7 wherein a plurality of piezoelectric layers 3 and a plurality of internal electrodes 5 are alternately laminated.

The internal electrode 5 is made up of an anode-side internal electrode 5a and a cathode-side internal electrode 5b.

Figure 2:
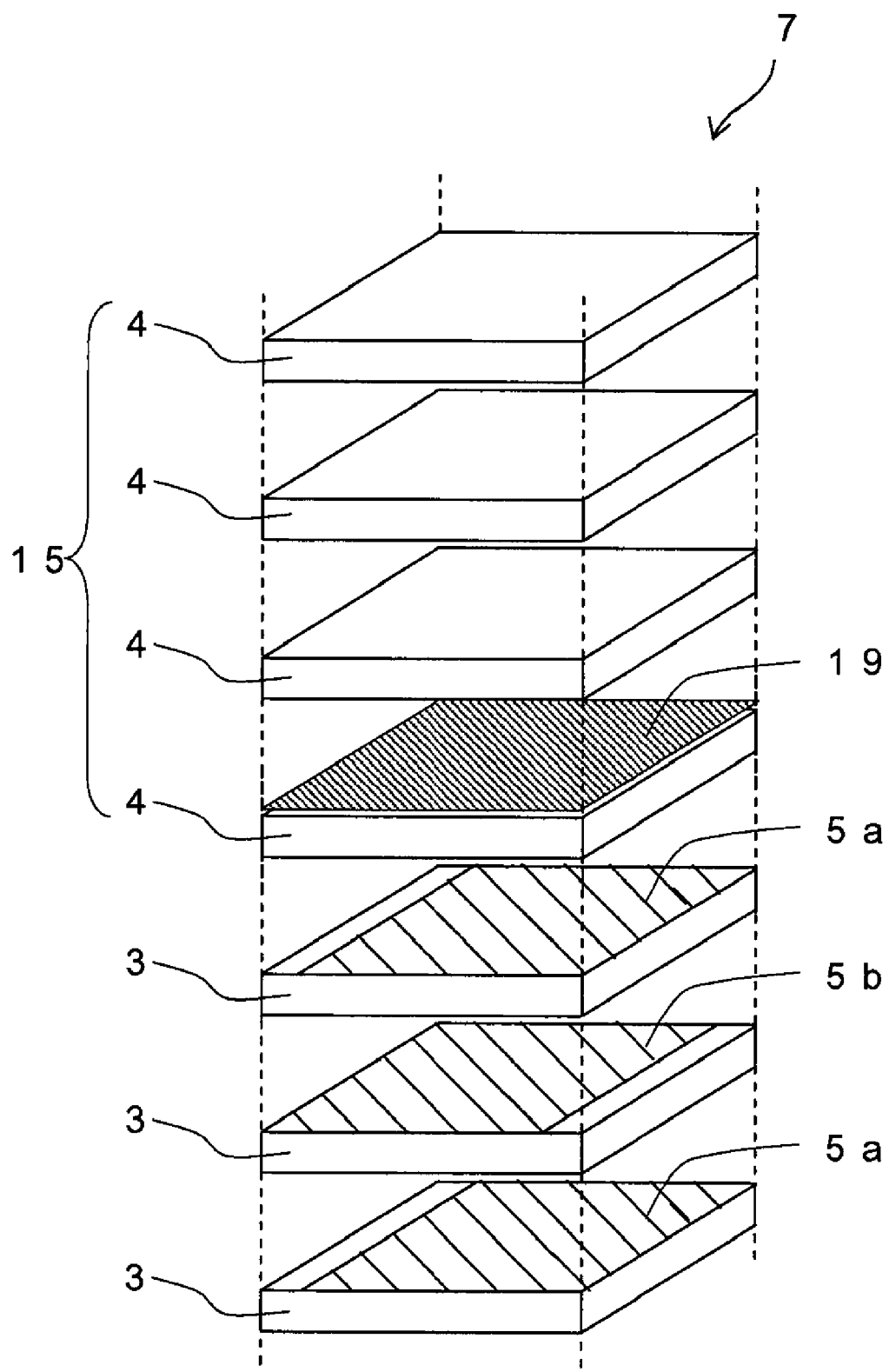
FIG. 2 illustrates an exploded view of a porous section and its vicinity in the laminated piezoelectric element according to the first embodiment of the present invention.

These internal electrodes 5a, 5b are alternately arranged. As shown in FIG. 2, the internal electrodes 5a, 5b are not formed on the entire main surface of the piezoelectric layer 3. The internal electrodes 5a, 5b are respectively arranged so that they are exposed on opposing lateral surfaces of the laminated structure 7 every two layers.

The opposing lateral surfaces of the laminated structure 7 are provided with an anode-side external electrode 9a and a cathode-side external electrode 9b, respectively. The plurality of anode-side internal electrodes 5a and the plurality of cathode-side internal electrodes 5b are electrically connected to the anode-side external electrode 9a and cathode-side external electrode 9b, respectively.

The laminated structure 7 has an opposing section (active section) 11 wherein the anode-side internal electrode 5a and cathode-side internal electrode 5b adjacent to each other in the laminating direction oppose in the laminating direction, and an end-side non-opposing section (inactive section) 15 which is a portion other than the opposing section 11 and is situated in a position closer to an end in the laminating direction than the opposing section 11. Since the end-side non-opposing section 15 is not sandwiched by internal electrodes of different polarities, it will not be displaced upon application of voltage.

The end-side non-opposing section 15 has a porous section (porous layer) 19 having porosity larger than that of the internal electrode 5. The porous section 19 is disposed between the piezoelectric layer 4 and piezoelectric layer 4 which are adjacent in the laminating direction. Owing to presence of a number of pores in the porous section 19, the piezoelectric layer 3 near the porous section 19 becomes likely to deform. As a result, even when stress concentrates in the end-side non-opposing section 15 which will not be displaced during driving of the element 1, the stress is dispersed and alleviated in the porous section 19. Owing to the presence of a number of pores in the porous section 19, the porous section 19 has stiffness lower than that of the internal electrode 5 and the piezoelectric layer 3. As a result, when stress is exerted on the end-side non-opposing section 15, it is possible to reduce occurrence of cracks in the piezoelectric layers 3 and internal electrodes 5 in the opposing section 11 by letting cracks occur in the porous section 19. Furthermore, piezoelectric ceramics as will be described later itself tends to deform. Therefore, when the material forming the end-side non-opposing section 15 is the piezoelectric ceramics, it is possible to obtain higher stress alleviating effect.

When the internal electrodes 5 are arranged at even intervals, resonance phenomenon can occur when the element 1 is driven, depending on a specific frequency determined by relationship between material constant of the piezoelectric layer 3 and distance between the internal electrodes. Beat tone can occur when resonance occurs. When there is the porous section 19 as is the case of the present embodiment, occurrence of beat tone can be reduced. In other words, as a result of presence of the porous section 19, it is possible to reduce occurrence of resonance phenomenon due to occurrence of variation in phase of acoustic wave.

Even when the element 1 is placed in such an environment where it is exposed to sudden temperature change, it is possible to reduce occurrence of malfunction resulting from difference in thermal expansion because of the provision of the porous section 19. Upon exposure to sudden temperature change, large temperature gradient arises in the element 1. Cracks can occur in the element 1 caused by the difference in thermal expansion occurring due to temperature gradient. On the other hand, owing to the presence of the porous section 19 where heat is difficult to be conducted than in the piezoelectric layer 3, heat transfer speed inside the element 1 becomes smaller. As a result, occurrence of large temperature gradient inside the element 1 is reduced. Also, when high voltage is instantly exerted on the element due to entry of some noise from a driving power supply, the element 1 is able to absorb impacts such as stress and heat caused by this in the porous section 19.

Porosity of the porous section 19 means a proportion (%) occupied by the area of voids 22 relative to a cross section area of the porous section 19 in the cross section of the laminated structure 7. When evaluation is made by a cross section which is parallel with the laminating direction in the laminated structure 7 (cross section shown in FIG. 1), a cross section area of the porous section 19 means an area of region sandwiched by the piezoelectric layers adjacent to each side of the porous section 19. As for porosity of the internal electrode 5, the same applies as the case with the porous section 19. The cross section to be evaluated may be a cross section perpendicular to the laminating direction in the laminated structure 7.

Porosity may be measured, for example, in the following manner. First, the laminated structure 7 is subjected to a polishing treatment using a known polishing means so that the cross section of the laminated structure 7 is exposed. To be more specific, polishing may be conducted by diamond paste using, for example, a table polishing machine KEMET-V-300 available from Kemet Japan Co., Ltd. as a polishing machine. The cross section that is exposed by this polishing treatment is observed, for example, under a scanning electron microscope (SEM), an optical microscope, or a metallurgical microscope, and thereby a cross section image is obtained. This cross section image is subjected to image processing, so that porosities of the internal electrode 5 and the porous section 19 can be determined.

Concretely, for images of the internal electrode 5 and the porous section 19 imaged under an optical microscope, a void part is painted over in black, and the part other than the void part is painted over in white. And the proportion of the black part, namely (area of black part)/(area of black part+area of white part) is determined, and the result is represented by percentage. In this manner, porosity can be calculated. In the case of a color cross section image, it may be converted into gray scale and separated into black part and white part. At this time, if it is necessary to set a threshold of borderline for separating into two gray scales, namely, black part and white part, the threshold of borderline may be set by image processing software or visual observation to realize binarization.

Porosity of the porous section 19 is preferably 10%-95%, and more preferably 50%-90%. When it is 10% or higher, it is possible to effectively reduce expansion of the cracks occurring in the porous section 19 into the piezoelectric layer 3 and/or internal electrode 5. When it is 95% or less, it is possible to keep the outline shape of the element 1 stably.

Figure 3:
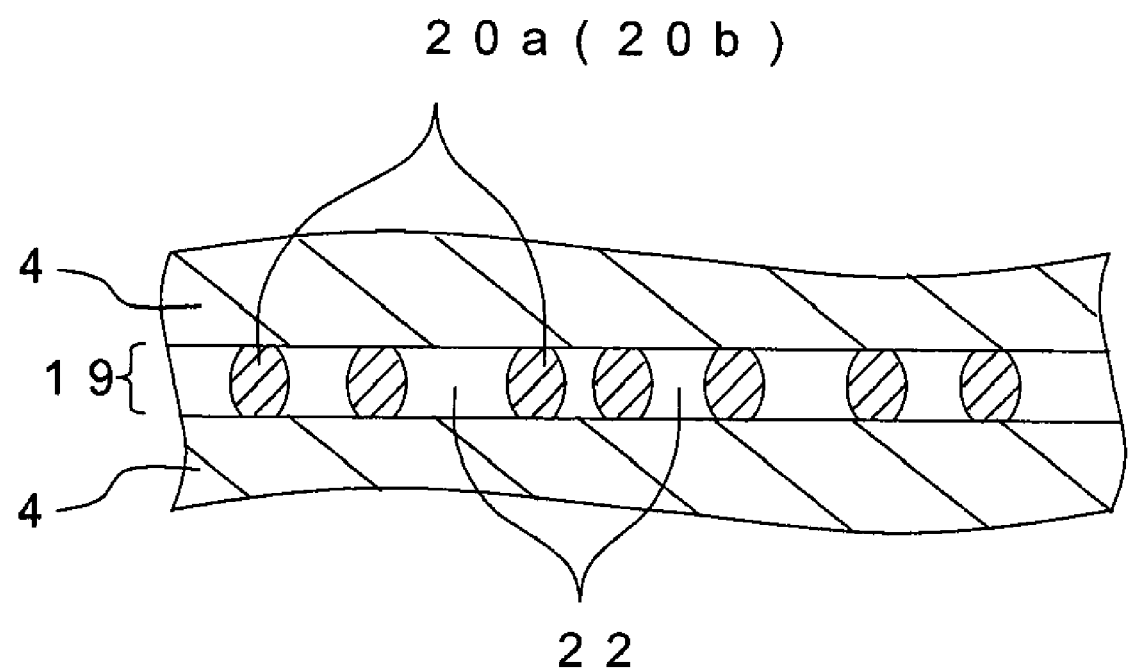
FIG. 3 illustrates an enlarged section view of a porous section in the laminated piezoelectric element shown in FIG. 1.

As shown in FIG. 3, in the porous section 19, it is preferred that at least one of a plurality of metal portions (partial metal layer) 20a consisting mainly of metal, and a plurality of ceramic portions (partial ceramic layer) 20b consisting mainly of ceramics are interspersed between adjacent two piezoelectric layers 4 via voids. By configuring the porous section 19 in this manner, the effect of alleviating stress by the porous section 19 at the time of exertion of stress on the element 1 is further improved.

When the porous section 19 has such a configuration as described above, flexibility of deformation of each of the metal portions 20a and/or ceramic portions 20b is high, so that the porous section 19 becomes more likely to deform. As a result, even when stress concentrates in the non-opposing section 15, it is possible to alleviate the stress more efficiently. Even when stress concentrates in a part of the metal portion 20a and/or ceramic portion 20b, it is possible to alleviate the stress by fracture of the metal portion 20a and/or ceramic portion 20b present in the part, from the piezoelectric layer 4, or by breakage of the metal portion 20a and/or ceramic portion 20b.

Preferably, the ceramic portion 20b is formed of piezoelectric ceramics. As a result, higher stress alleviating effect is obtained. This is attributable to the fact that when the ceramic portion 20b deforms by application of stress, arrangement of ions in piezoelectric crystals shifts and crystal structure deforms according to the direction of stress.

Preferably, the plurality of metal portions 20a are interspersed while they are separated and electrically insulated from each other. When the metal portions 20a are formed in this manner, even when the piezoelectric layer 3 in the vicinity thereof deforms and electromotive force arises, the porous section 19 reduces or suppresses movement of electric charges, so that occurrence of electric short circuit within the element 1 can be reduced. Even when electromotive force caused by deformation of the piezoelectric layer 4 arises in the end-side non-opposing section 15 and electric charges are unbalanced, the porous section 19 is able to shield the part from the opposing section 15 to some extent. As a result, it is possible to reduce movement of ions such as oxygen hole, and hence it is possible to reduce characteristic change of the piezoelectric layer 3.

In particular, the porous section 19 preferably has both the metal portion 20a and the ceramic portion 20b formed of piezoelectric ceramics which are interspersed. By forming the porous section 19 in this manner, durability of the element 1 is further improved. The metal portion 20a realizes high effect of alleviating stress by deforming upon application of stress. The ceramic portion 20b formed of piezoelectric material realizes high effect of alleviating stress by shift of ion arrangement in crystal of piezoelectric material and resultant change in crystal when stress is exerted.

In the porous section 19, it is preferred that the plurality of metal portions 20a and/or the plurality of ceramic portions 20b are interspersed substantially uniformly. As a result, stress alleviating effect is obtained almost over the entire region of the porous section 19.

Preferably, the porous section 19 has a site in which the metal portion 20a and ceramic portion 20b formed of piezoelectric material contact each other. When such porous section 19 is formed, the effect of alleviating stress is further improved. As already mentioned, the stress alleviating operation and effect of the metal portion 20a and the ceramic portions 20b have respective features. When the metal portion 20a and the ceramic portion 20b contact each other, these features are exerted more effectively. As a result, it is possible to form the porous section 19 having higher response speed with respect to stress, and larger stress alleviating effect. For example, when the ceramic portion 20b covers the metal portion 20a or when the metal portion 20a covers the ceramic portion 20b, namely, when the metal portion 20a and the ceramic portion 20b are integrated, the stress alleviating effect is further increased.

As a material of the porous section 19, for example, element metal such as copper or nickel, materials including silver-platinum alloy, silver-palladium alloy and the like can be recited. In particular, it is preferred to use silver-palladium as a main ingredient from the view point of having migration resistance, oxidation resistance, low Young's modulus, and low cost. When silver is a main ingredient, it may be burnt concurrently with the piezoelectric layer 3 to form the element 1. Since it has high heat conductivity, even when the element 1 is locally heated due to concentration of stress, the heat can be dispersed efficiently. Further, when film of oxidation layer is not formed on the surface, the stress alleviating effect is high because metal particles have excellent flexibility. As a material of the porous section 19, piezoelectric ceramics as described above may be used. Concretely, perovskite-type oxide such as lead zirconate titanate ($PbZrO_3$—$PbTiO_3$) may be used.

As a material of the piezoelectric layers 3, 4, any ceramics having piezoelectricity may be used without particular limitation, and preferably, ceramics having high piezoelectric strain constant d33 is used. Concretely, it is preferred to use perovskite-type oxide such as lead zirconate titanate ($PbZrO_3$—$PbTiO_3$) as a main ingredient.

As a material of the internal electrode 5, any ceramics having conductivity may be used without particular limitation, and for example, metal such as copper or nickel, or alloy such as silver-platinum alloy or silver-palladium alloy may be used. In particular, from the view point of migration resistance and oxidation resistance, low Young's modulus and low cost, a material consisting mainly of silver-palladium is preferred.

As a material of the external electrode 9, any material having excellent conductivity may be used. For example, metal such as copper or nickel, or alloy thereof may be used. In particular, silver or alloy consisting mainly of silver is preferably used from the view point of low electric resistance and easy handling.

Composition of the element 1 can be analyzed in the following manner. First, a part of the porous section 19 is collected, for example, by cutting the laminated structure 7 so that a measuring site of the porous section 19 and the like is exposed. Then, chemical analysis such as ICP (inductively coupled plasma) luminescence analysis may be conducted to measure composition of the porous section 19. The cutting surface of the element 1 may be analyzed by using an analysis method such as EPMA (Electron Probe Micro Analysis) method.

Next, a production method of the element according to the embodiment will be explained. First, calcined powder of piezoelectric ceramics of perovskite-type oxide made of $PbZrO_3$—$PbTiO_3$ or the like, a binder of acryl-based or butyral-based organic polymer, and a plasticizer such as DBP (dibutyl phthalate) or DOP (dioctyl phthalate) are mixed to prepare a slurry. Then, this slurry is subjected to a well-known tape molding method such as doctor blade method or calendar roll method, to prepare a plurality of ceramic green sheets.

Next, metal powder such as silver-palladium forming the internal electrode 5 is added and mixed with a binder, a plasticizer and the like, to prepare a conductive paste for internal electrode. The prepared conductive paste is printed in a thickness of about 1 to 40 μm on top surface of the aforementioned green sheet by screen printing or the like.

The region which is to be the porous section 19 is prepared in the following manner. First, metal powder such as silver-palladium is added and mixed with a binder, a plasticizer and the like, to prepare a conductive paste. This conductive paste is printed in a thickness of about 1 to 10 μm in a region where the porous section 19 is to be formed on the top surface of the ceramic green sheet. Then, on the top of the printed surface, a paste prepared by adding and mixing a binder, a plasticizer and the like to resin beads such as acryl beads in which metal titanium powder is mixed, or a paste prepared by adding and mixing a binder, a plasticizer and the like into carbon powder in which metal titanium powder is mixed, is printed in a thickness of about 1 to 10 µm. Further, on the top surface of the printed surface, the conductive paste is printed in a thickness of about 1 to 10 µm.

As for the part printed with the paste in which resin beads and the like are mixed, acryl beads or carbon powder is burnt down in the subsequent burning process, and surrounding metal powder is sintered. At this time, a metal titanium component such as titanium metal and titanium oxide is present in the interface between the surrounding metal and the space where acryl beads or carbon powder is burnt down, to maintain the burnt down space. Thereafter, the metal titanium component is diffused into metal or piezoelectric layer, and thus the porous section 19 is formed. A titanium compound such as titanium oxide or hydrogenated titanium may be used in place of the titanium metal. Preferably, titanium metal is used in the point that it diffuses after burning and the titanium compound is less likely to remain in the interface between the space and metal.

The paste in which resin beads or the like are mixed may be added with calcined powder of piezoelectric ceramics of perovskite-type oxide of $PbZrO_3$—$PbTiO_3$ or the like. By adding calcined powder of piezoelectric ceramics, it is possible to consist the porous section 19 of metal portions and ceramic portions. When calculated powder of the piezoelectric ceramics is added in place of titanium metal, it is possible to form the porous section 19 containing ceramic portions.

The porous section 19 may be formed in the following manner. The conductive paste prepared in the same manner as described above is printed in a thickness of about 1 to 10 µm on the ceramic green sheet as described above, and then on the printed surface, a thin film such as alumina film, silicon nitride film, or silica film of about 0.1 to 5 µm thick is formed by a thin film producing method such as sputtering. Then, on this thin film formed surface, the conductive paste is printed in a thickness of about 1 to 10 µm.

By burning process, the part where thin film including alumina film, silicon nitride film, silica film or the like is formed becomes an alumina layer, a silicon nitride layer or a silica layer of about 0.1 to 5 µm thick. In the region where an alumina layer, a silicon nitride layer or a silica layer is formed, the laminated structure 7 expands or contracts and stress is exerted on the porous section 19 by a polarizing treatment as will be described later, so that voids are formed between the alumina layer, the silicon nitride layer, or the silica layer, and silver-palladium layer. As a result, the porous section 19 having voids is formed. In particular, by executing a reversing treatment for reversing polarity of polarizing treatment, expansion or contraction of the laminated structure 7 becomes significant, and voids are formed efficiently in a short time.

The porous section 19 may be formed in the following manner. The conductive paste prepared in the same manner as described above is printed in a thickness of about 1 to 10 µm on the ceramic green sheet as described above. On this, alumina foil, silicon nitride foil, or silica foil is placed in a thickness of about 0.1 to 5 µm. Then, the conductive paste which is to be the porous section 19 is printed again in a thickness of about 1 to 10 µm.

By burning process, the part where the alumina foil, silicon nitride foil, or silica foil is placed becomes an alumina layer, a silicon nitride layer or a silica layer of about 0.1 to 5 µm thick. These regions are formed with voids by polarizing treatment in the same manner as described above.

The porous section 19 may be formed in the following manner. The conductive paste prepared in the same manner as described above is printed in a thickness of about 1 to 10 µm on the ceramic green sheet as described above. Then on this printed surface, a paste in which a binder, a plasticizer or the like is added and mixed into BN powder or quartz phase $SiO_2$ powder is printed in a thickness of about 1 to 10 µm. Then the conductive paste is printed in a thickness of about 1 to 10 µm.

In burning process, the part where the paste in which BN powder or $SiO_2$ powder is mixed is printed becomes a BN layer or a layer of quartz phase $SiO_2$. In these regions, by conducting polarization treatment in the same manner as described above, voids are formed between the BN layer or the $SiO_2$ layer and the silver-palladium layer.

The porous section 19 may be formed in the following manner. A conductive paste is prepared by adding and mixing a binder, a plasticizer and the like in metal powder such as silver-palladium. Then a binder, a plasticizer and the like are added and mixed into metal powder having a silver concentration higher than that of the above conductive paste, to prepare a conductive paste for porous section. These conductive pastes are respectively printed in a thickness of about 1 to 40 µm on the top surface of the green sheet by screen printing or the like. These green sheets are laminated so that they are adjacent in the laminating direction.

In burning process, silver in the conductive paste for porous section diffuses on the side of the conductive paste having a silver concentration lower than that of the former paste. As a result, voids are formed in the part where silver diffuses after burning, and thus the porous section is formed. On the other hand, into the conductive paste adjacent the conductive paste for porous section, silver diffuses from the conductive paste for porous section, so that the conductive paste becomes a highly sensitive layer after burning. This method is suited when the end-side non-opposing section 15 is provided with the porous section 19 and a high density layer 21.

By adding calcined powder of piezoelectric ceramics together with metal powder such as silver-palladium alloy into the conductive paste for porous section, the porous section 19 consists of metal portions and ceramic portions after burning. By varying the blending ratio of silver-palladium powder and calcined powder piezoelectric ceramics, it is possible to change the ratio between the metal portions and the ceramic portions in the porous section 19.

Metal powder of silver-palladium or the like may be alloy powder, or the composition may be adjusted by using mixed powder of silver powder and palladium powder. Also, the composition may be adjusted by adding silver powder or palladium powder to silver-palladium alloy powder.

Then the green sheets on which the conductive paste for internal electrode, the conductive paste for porous section and the like are printed are laminated to obtain a laminated formed body. After executing binder removal from the laminated formed body at a predetermined temperature, burning at 900 to 1200° C. was conducted to obtain the laminated structure 7.

Preferably, metal powder constituting the internal electrode 5 such as silver-palladium is added into the green sheet forming the end-side non-opposing section 15. This makes contraction behavior of the end-side non-opposing section 15 at the time of sintering of the piezoelectric layer 3, more similar to that of the other part. From a similar reason, in the green sheet on which the end-side non-opposing section 15 is to be formed, the one similar to the conductive paste for internal electrode may be printed on the green sheet, so that contraction behavior at the time of burning is similar between the opposing section and non-opposing section.

The laminated structure 7 is not limited to those produced by the production methods as described above, and may be formed by other production method as far as the laminated structure 7 wherein the plurality of piezoelectric layers 3 and the plurality of internal electrodes 5 are alternately laminated is formed.

Next, the laminated structure 7 is formed with the external electrode 9 by a known means, so that the element 1 is obtained. Finally, lead wire (not illustrated) is connected with the external electrode 9, and DC voltage of 0.1 to 3 kV/mm is applied on a pair of external electrodes 9 via the lead wire, to effect polarization treatment on the laminated structure 7. Further, surface of the element 1 may be covered with resin such as silicone resin. In this case, by allowing the covering resin to enter voids of the porous section 19 which are open in the lateral surface of the element 1, adhesion strength of covering resin improves due to anchoring effect.

Second Embodiment

Figure 4:
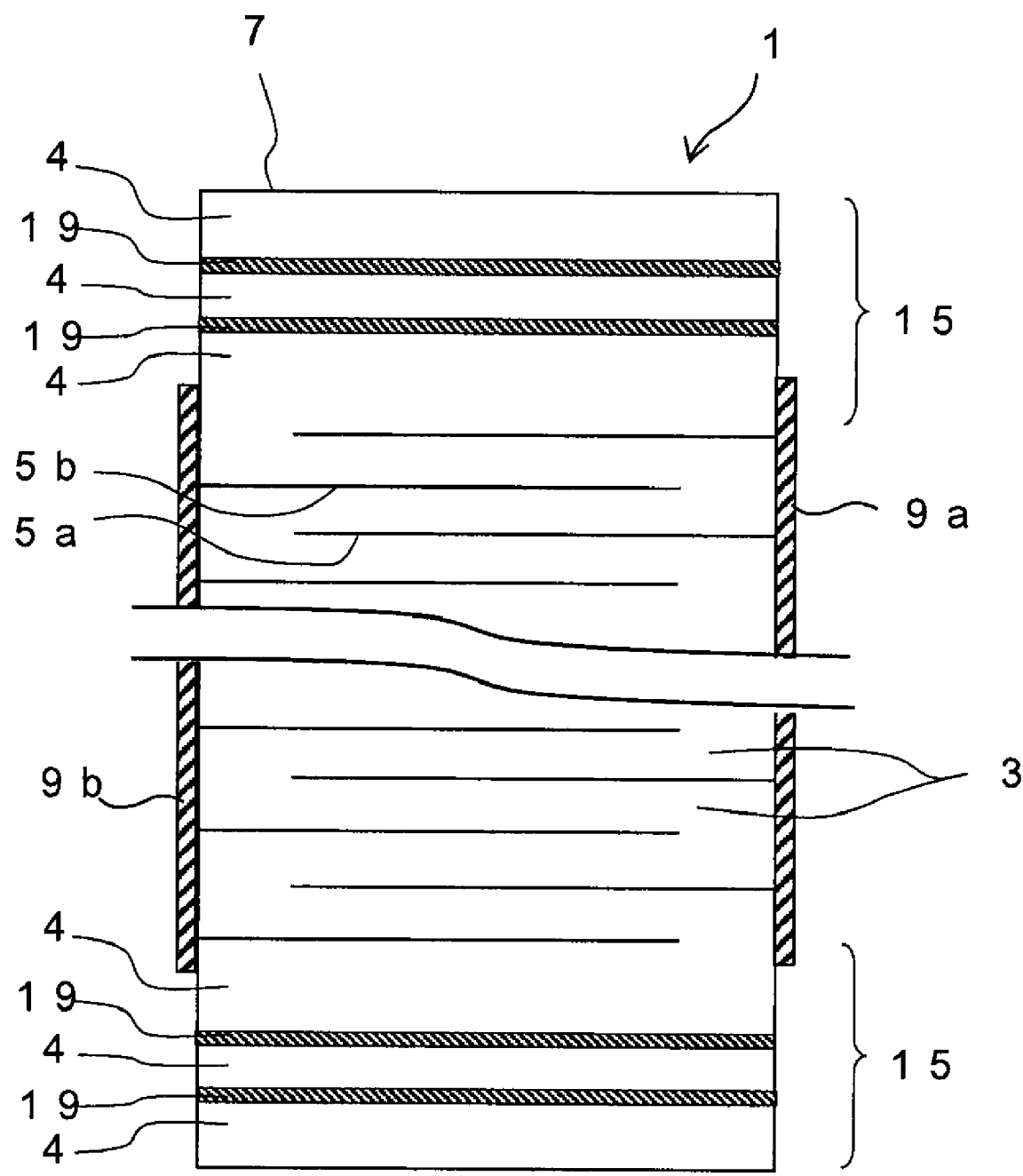
FIG. 4 illustrates a section view of a laminated piezoelectric element according to a second embodiment of the present invention.

As shown in FIG. 4, the end-side non-opposing section 15 may be formed with the plurality of porous sections 19. Presence of plurality of porous sections 19 in the end-side non-opposing section 15 makes it possible to disperse stress exerted on the element 1 more efficiently. Also, swell occurring when nonuniform driving arises in the direction perpendicular to laminating direction can be more efficiently. This in turn improves the effect of reducing occurrence of beat tone. Further, since occurrence of harmonics signal is reduced, it is possible to reduce occurrence of noise to a control signal. Other configuration is similar to that described in the first embodiment, and explanation thereof will not be given while using the same reference numerals (explanation will not be given while using the same reference numerals, for third and later embodiments).

Third Embodiment

Figure 5:
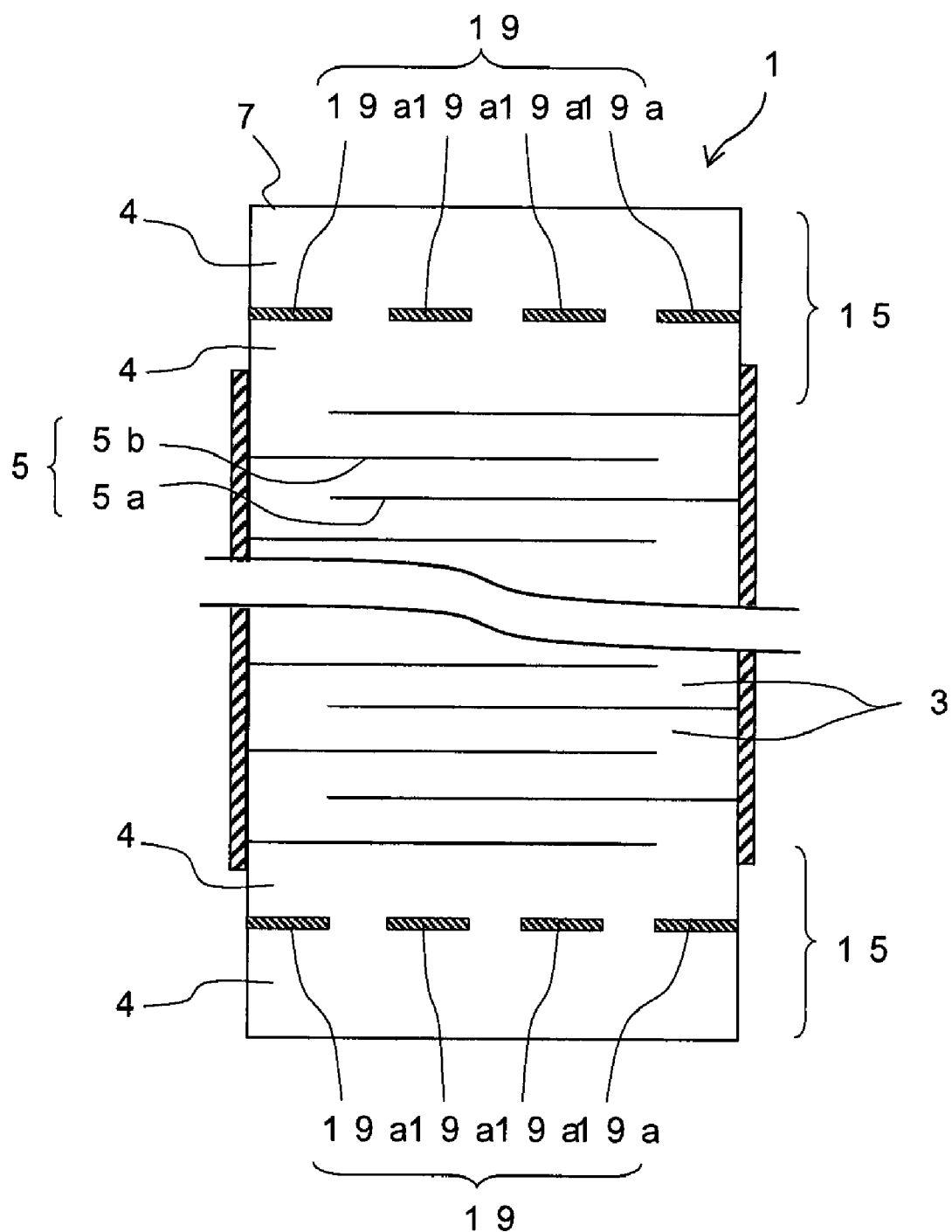
FIG. 5 illustrates a section view of a laminated piezoelectric element according to a third embodiment of the present invention.
Figure 6:
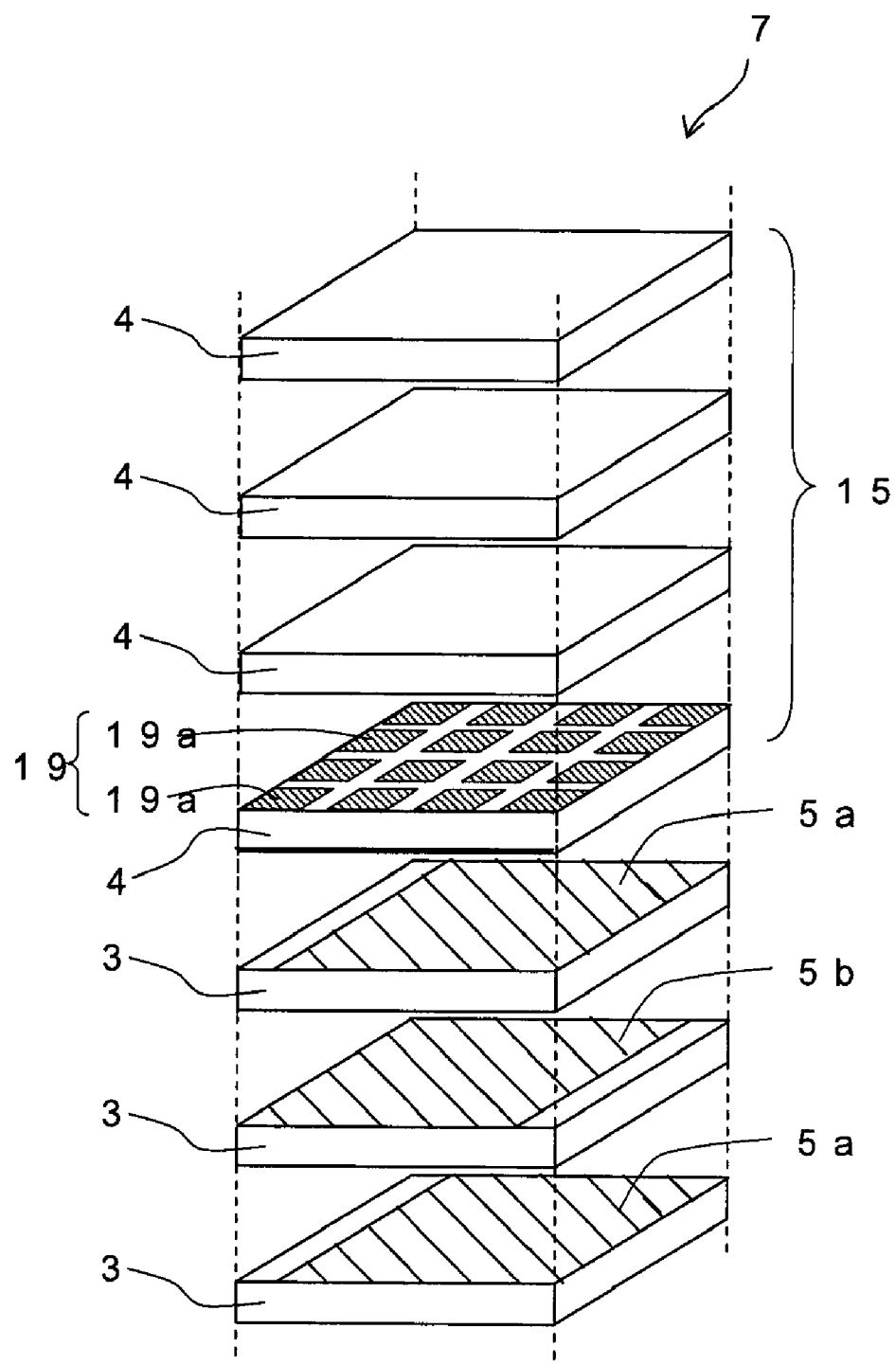
FIG. 6 illustrates an exploded view of a porous section and its vicinity in the laminated piezoelectric element according to the third embodiment of the present invention.

As shown in FIGS. 5 and 6, the porous section 19 may be made up of a plurality of split porous sections 19a arranged separately so that they are spaced from each other. These split porous sections 19a are arranged in the same plane perpendicular to the laminating direction as shown in FIG. 6. By arranging the split porous sections 19a in the same plane in this manner, stress can be efficiently absorbed in each of the split porous sections 19a even when nonuniform stress arises in this plane direction. Further, since each of the split porous sections 19a is independent, even when unexpected large stress exerts on part of split porous sections 19a, and the split porous section 19a is broken, the influence is less likely to transmit to other split porous sections 19a. Therefore, other split porous sections 19a do not break and the shape is maintained. As a result, stress alleviating effect is exerted for a long time. Preferably, the plurality of split porous sections 19a are arranged regularly in the plane direction. This makes it possible to realize the stress alleviating effect while it is dispersed more uniformly in the plane.

Fourth Embodiment

Figure 7:
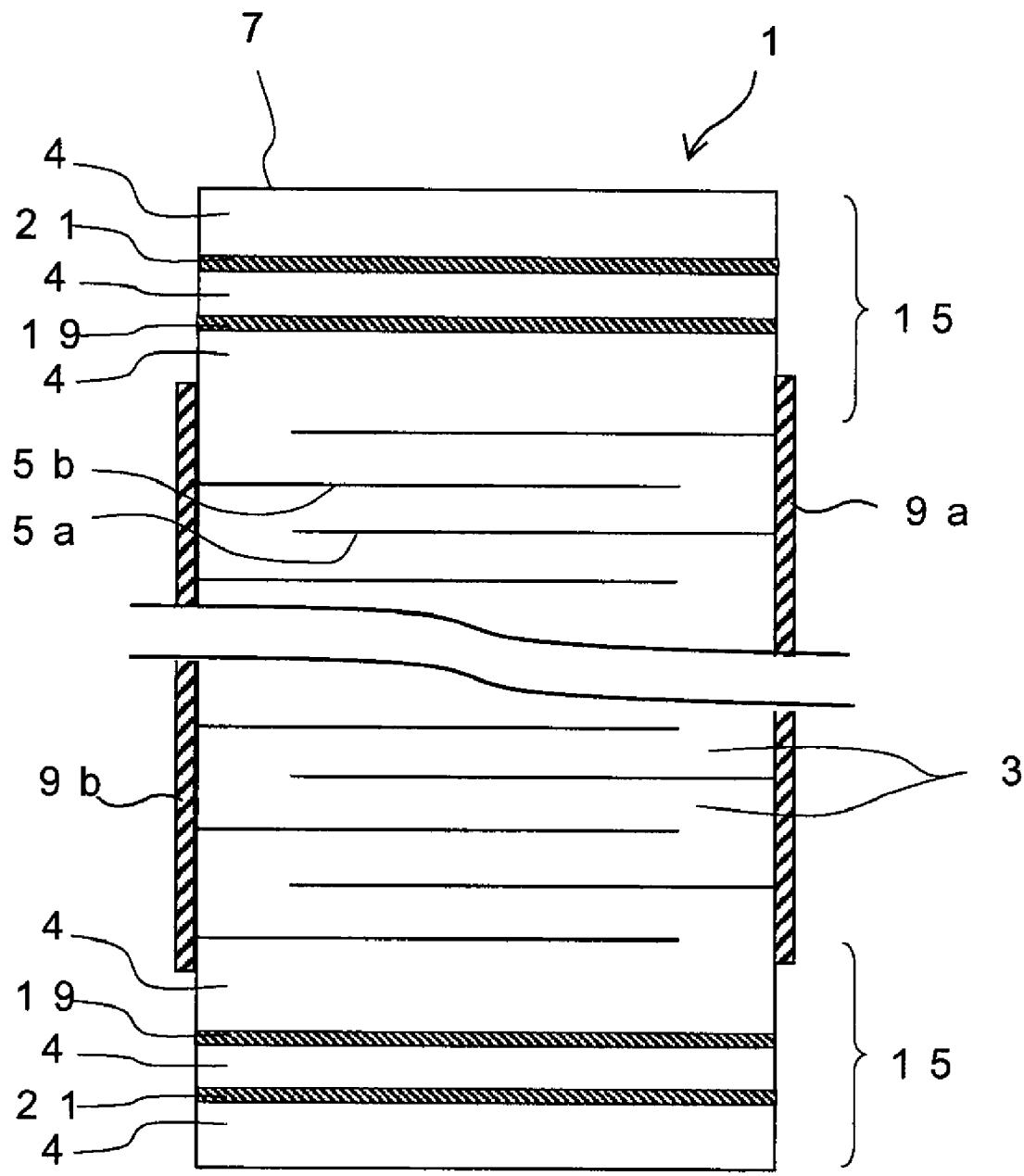
FIG. 7 illustrates a section view of a laminated piezoelectric element according to a fourth embodiment of the present invention.

As shown in FIG. 7, the end-side non-opposing section 15 preferably has the porous section 19, and the high density layer 21 having porosity smaller than that of the internal electrode 5. Since there is the high density layer 21 that is disposed in line with the porous section 19 via the piezoelectric layer and is not electrically connected with the external electrode 9, the effect of reducing concentration of stress on the piezoelectric layer 3 and the internal electrode 5 is further improved when stress is exerted on the element 1.

As shown in FIG. 7, by disposing the high density layer 21 in the position closer to the end of the laminated structure 7 than the porous section 19, the electromotive force arising due to deformation of piezoelectric body in the vicinity of the porous section 19 can be dispersed more uniformly in the plane without being unbalanced in the end-side non-opposing section 15. As a result, it is possible to reduce formation of space charge layer in the piezoelectric body, and thus it is possible to reduce formation of oxygen hole ion arising by the space charge layer. As a result, it is possible to reduce deterioration of insulation by movement of oxygen hole ion, and hence it is possible to further improve the durability of the element.

As a material of the high density layer 21, metal such as silver, copper, nickel or alloy such as silver-platinum alloy or silver-palladium alloy may be used as a main ingredient for allowing movement of electric charge to rapidly propagate in the element. In particular, silver-palladium is preferably used as a main ingredient because it has migration resistance and oxidation resistance, and is low in Young's modulus and cost. Furthermore, the high density layer 21 is preferably made of silver from the same reason as in the porous section 19. From the view point of rapid propagation of stress, a material having high Young's modulus is preferred, and a ceramic layer consisting mainly of perovskite-type oxide such as silicon nitride, alumina, zirconia, titania, and lead zirconate titanate ($PbZrO_3$—$PbTiO_3$), a diamond layer and the like are recited.

Fifth Embodiment

Figure 8:
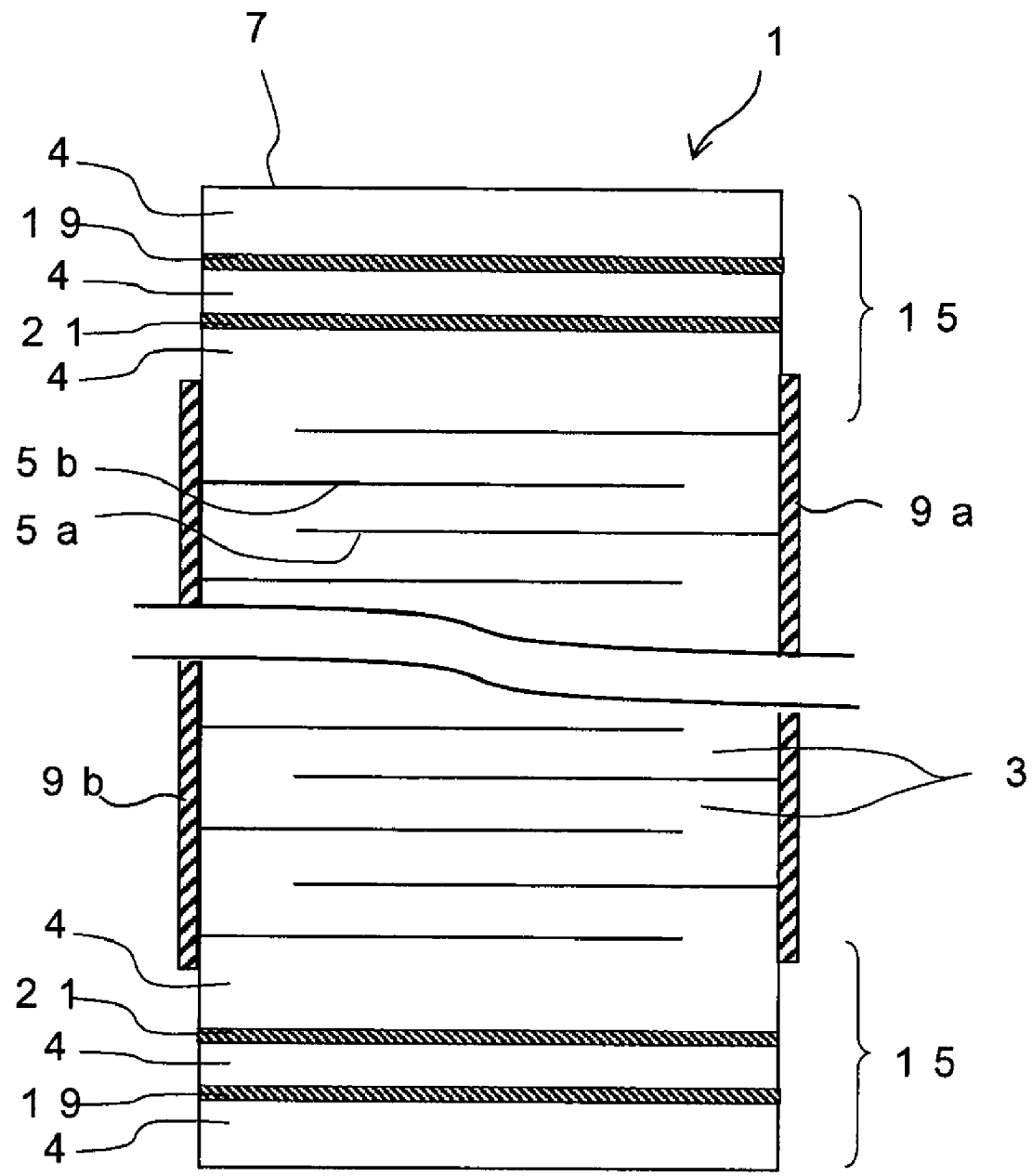
FIG. 8 illustrates a section view of a laminated piezoelectric element according to a fifth embodiment of the present invention.

As shown in FIG. 8, the porous section 19 may be disposed in a position closer to the end of the laminated structure 7 than the high density layer 21. Even when electromotive force arises owing to deformation of the piezoelectric body near the borderline between the internal electrode 5 positioned in the end part and the end-side non-opposing section 15, the electric charge is captured into the high density layer 21. Therefore, it is possible to reduce propagation of the generated electromotive force to the end of the element 1. Since this electric charge is captured into the high density layer 21, it is possible to reduce propagation of electric charge to the side of the internal electrode 5. As a result, it is possible to reduce formation of space charge layer in the piezoelectric body, and hence it is possible to reduce formation of oxygen hole ion occurring by the space charge layer. Since it is possible to prevent deterioration of insulation by movement of oxygen hole ion, durability of the element can be further improved.

Sixth Embodiment

Figure 9:
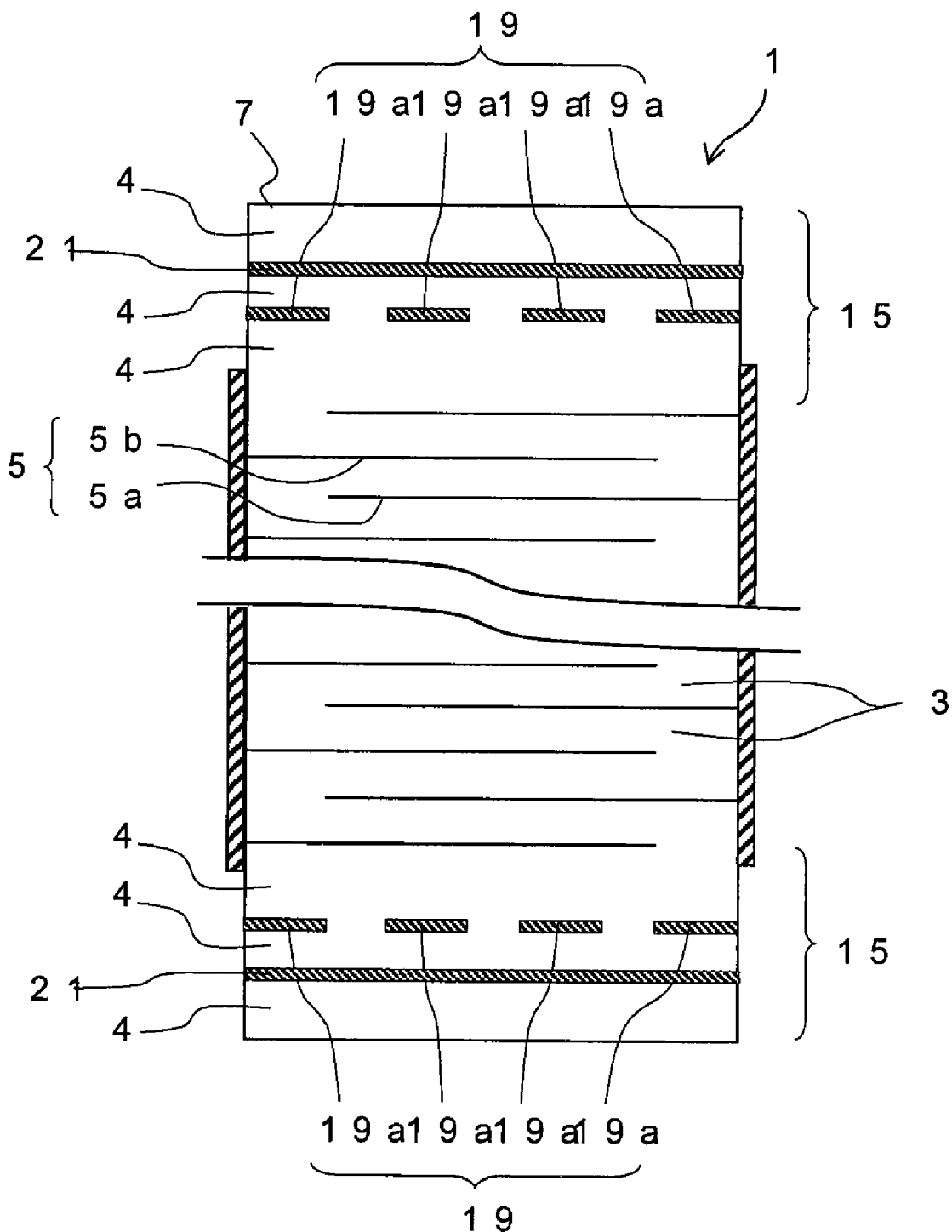
FIG. 9 illustrates a section view of a laminated piezoelectric element according to a sixth embodiment of the present invention.
Figure 10:
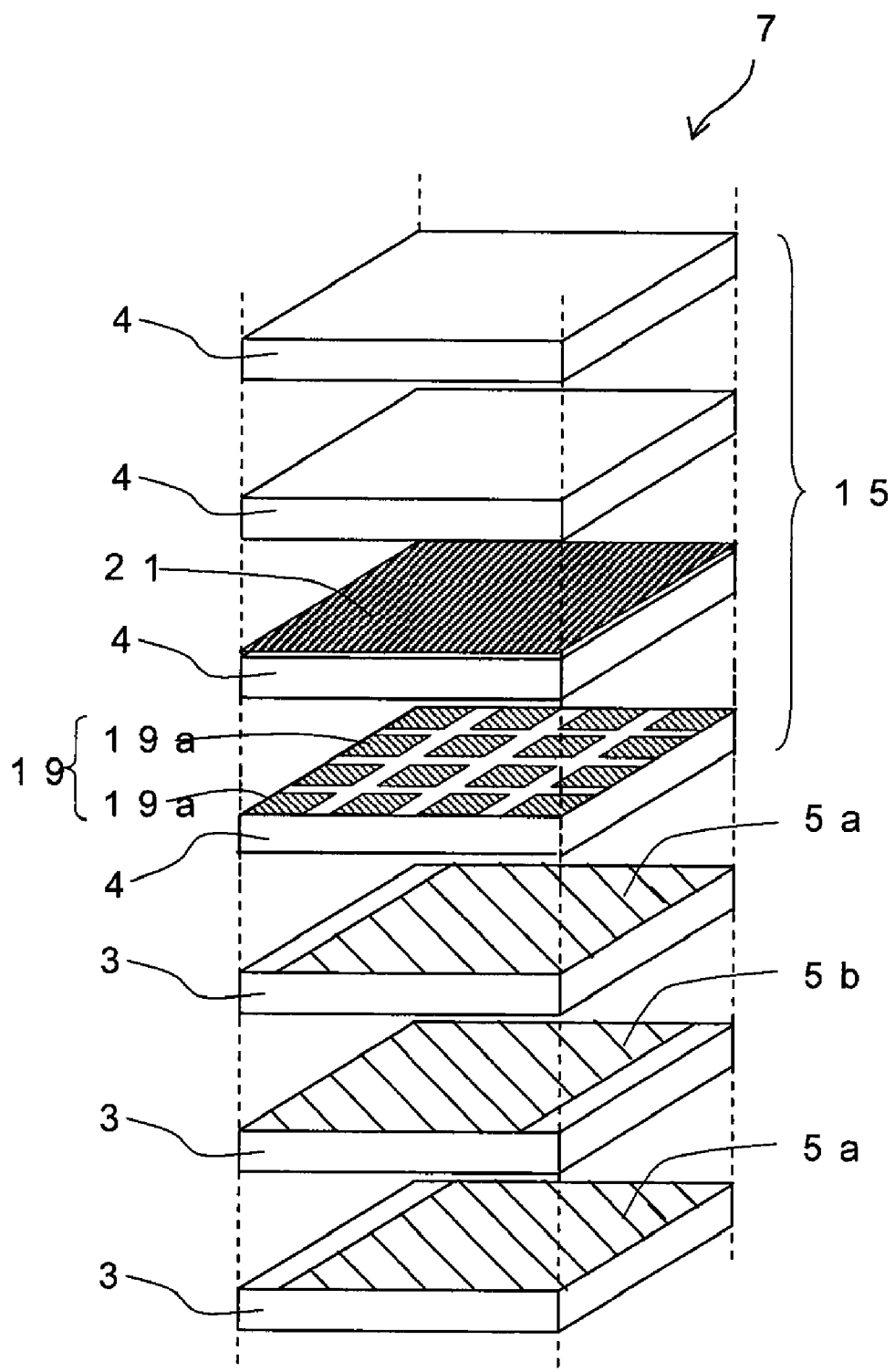
FIG. 10 illustrates an exploded view of a porous section and its vicinity in the laminated piezoelectric element according to the sixth embodiment of the present invention.

In the embodiment shown in FIGS. 9 and 10, the high density layer 21 is formed in the position closer to the end of the laminated structure 7 than the porous section 19 made up of the plurality of split porous sections 19a. Stress is alleviated also by piezoelectric body surrounding the split porous sections 19a deforming in association with driving deformation of the opposing section 11. This deformation of piezoelectric body causes generation of electromotive force. Since electric charges occurring at this time are dispersed into each of the split porous sections 19a which are independent from each other, the electric charges are more easily and uniformly dispersed without being unbalanced in the plane.

Seventh Embodiment

Figure 11:
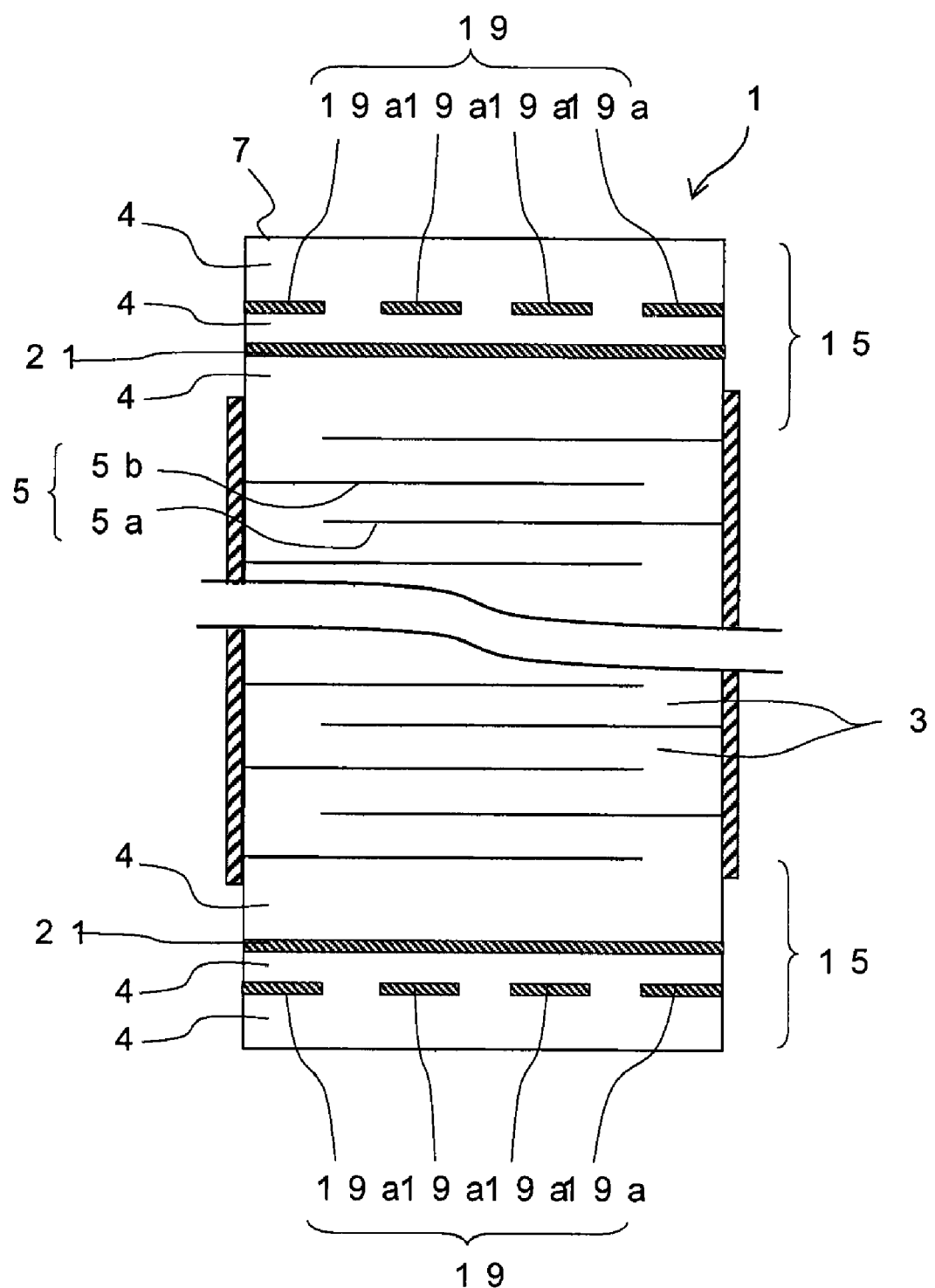
FIG. 11 illustrates a section view of a laminated piezoelectric element according to a seventh embodiment of the present invention.

In the embodiment shown in FIG. 11, the high density layer 21 is formed in the position closer to the internal electrode 5 than the porous section 19 made up of the plurality of split porous sections 19*a*. The piezoelectric body between the internal electrode 5 and the high density layer 21 deforms in association with driving of the element 1, and electromotive force arises. Electric charges arising at this time are captured in the high density layer 21, and propagation to the end of the element 1 is reduced. Also, stress is alleviated by deformation of piezoelectric body surrounding the split porous sections 19*a*. Electric charges arising at this time are captured in the high density layer 21, and propagation of electric charge to the internal electrode 5 can be reduced.

Eighth Embodiment

Figure 12:
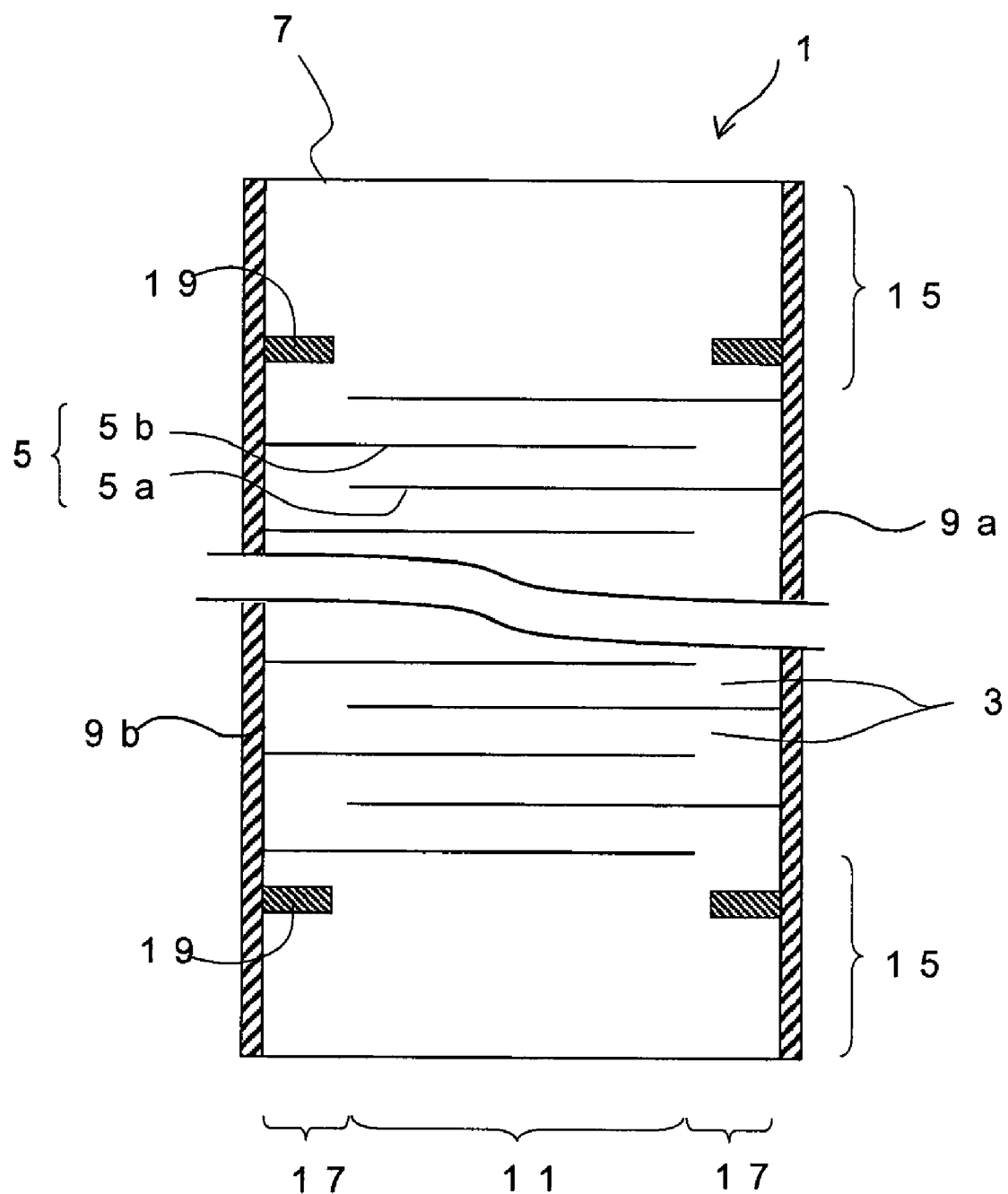
FIG. 12 illustrates a section view of a laminated piezoelectric element according to an eighth embodiment of the present invention.

As shown in FIG. 12, in the end-side non-opposing section 15, the porous section 19 may be disposed in the position near the lateral surface of the laminated structure 7. By disposing the porous section 19 in this manner, it is possible to obtain the effect combining the stress alleviating effects of the end-side non-opposing section 15 and the lateral-side non-opposing section 17. In addition, since the proportion occupied by the porous section 19 can be made small, it is possible to reduce deterioration of strength of the element. Such a configuration is effective in the structure where the dimension in the laminating direction of the element 1 is smaller than the dimension in the direction perpendicular to the laminating direction. Also, the configuration of the porous section 19 is effective when the number of lamination of the internal electrode 5 is small. Concretely, it is effective to dispose the porous section 19 in the manner as described above when the number of laminated layers is 10 or less.

Ninth Embodiment

Figure 13:
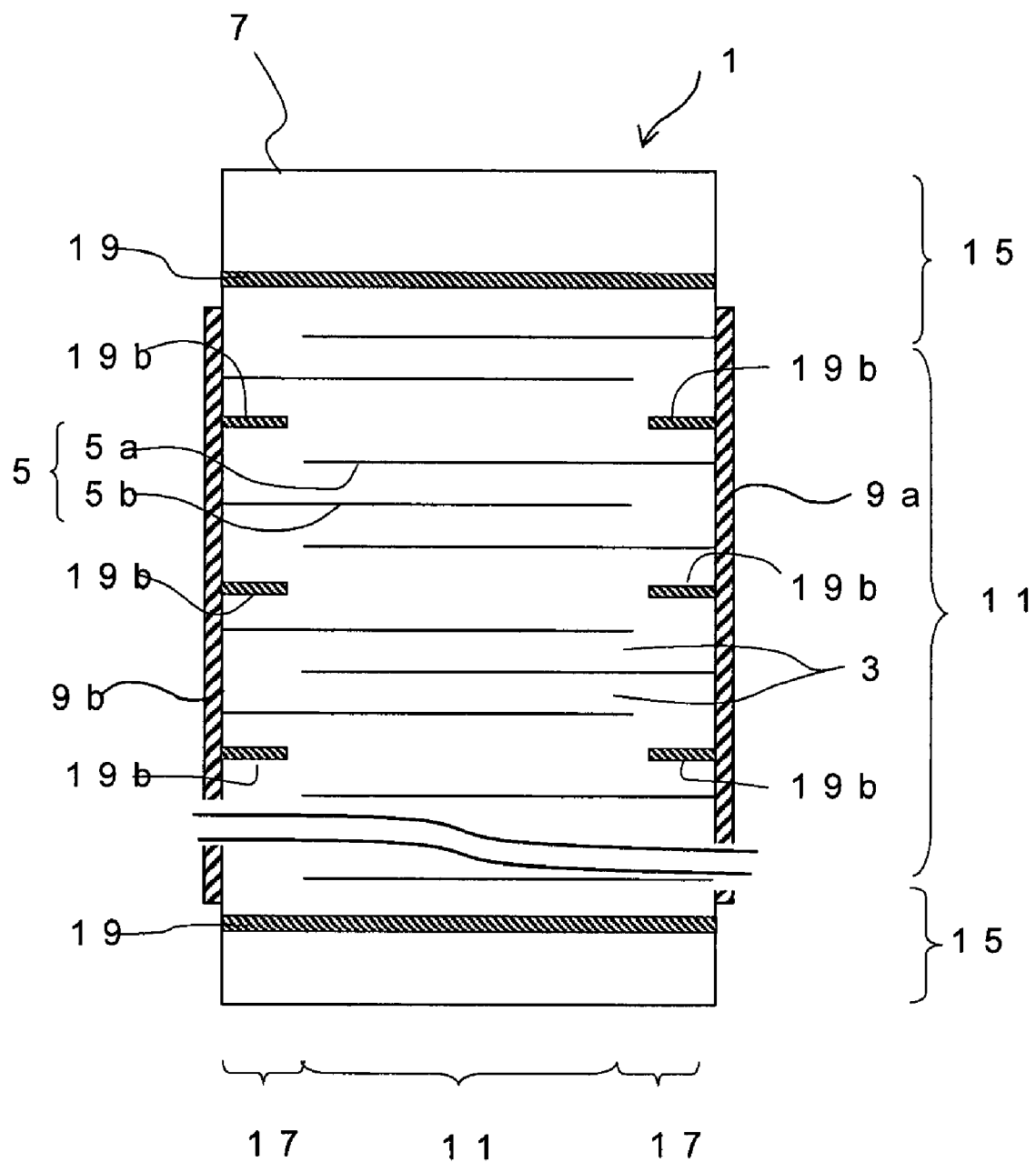
FIG. 13 illustrates a section view of a laminated piezoelectric element according to a ninth embodiment of the present invention.

As shown in FIG. 13, it is preferred to provide the end-side non-opposing section 15 with the porous section 19 and to provide the lateral-side non-opposing section 17 with the porous section 19*b*. Also as shown in FIG. 13, the porous section 19 may be located closer to the opposing section 11 than the end portion (end of the laminated structure in the laminating direction) of the end-side non-opposing section 15. By providing the porous sections 19, 19*b* in this manner, the respective porous sections are able to mutually compensate the distortion in the element 1 rather than exerting stress alleviating effect individually. As a result, the axis of the element 1 at the time of driving is less likely to be displaced, and stable driving can be realized.

Reference Example 1

Figure 14:
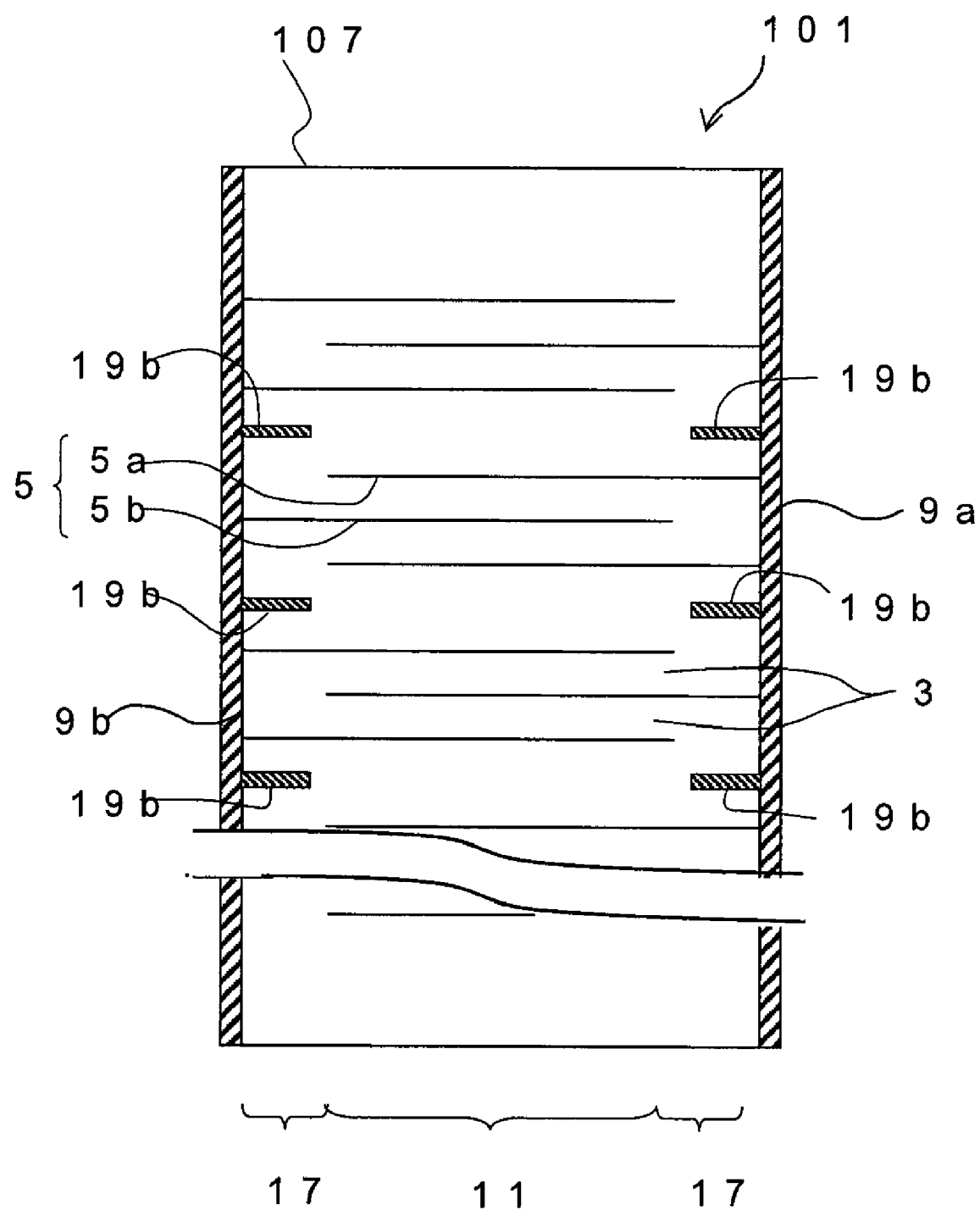
FIG. 14 illustrates a section view of Reference Example 1 of a laminated piezoelectric element.
Figure 15:
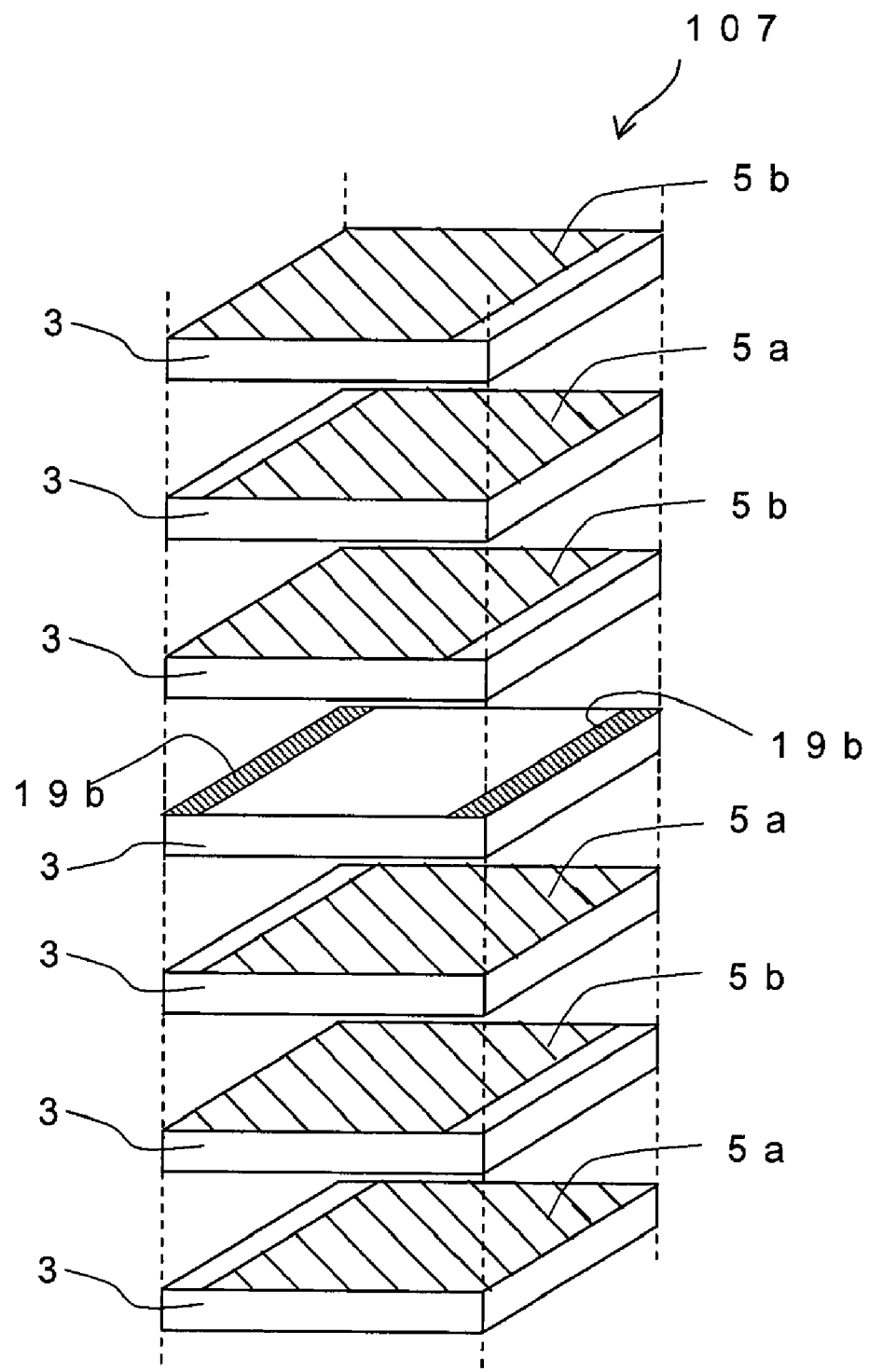
FIG. 15 illustrates an exploded view of a porous section and its vicinity in Reference Example 1.

As shown in FIGS. 14 and 15, the laminated structure 107 in the element 101 has the opposing section 11 wherein internal electrodes 5 of different polarities adjacent to each other in the laminating direction oppose in the laminating direction, and a lateral-side non-opposing section (inactive section) 17 which is a portion other than the opposing section 11 and is disposed between the opposing section 11 and the lateral surface of the laminated structure 107. In this element 101, the lateral-side non-opposing section 17 is provided with the porous section 19*b* having porosity larger than that of the internal electrode 5. As a result, it is possible to alleviate stress in the lateral-side non-opposing section 17.

Preferably, the porous section 19*b* is provided between the plane containing the main surface of the anode-side internal electrode 5*a*, and the plane containing the main surface of the cathode-side internal electrode 5*b* which is adjacent to the anode-side internal electrode 5*a* in the laminating direction. With this configuration, cracks are less likely to expand to the internal electrode 5 compared to the case where the porous section 19*b* is provided on the same plane with the internal electrode 5. Further, it is possible to concentrate the stress exerted between the internal electrodes 5 at the time of driving in the porous section 19*b*, and to alleviate the stress.

In the lateral-side non-opposing section 17, it is preferred that a plurality of the porous sections 19*b* are formed in the laminating direction as shown in FIG. 14. By forming the plurality of porous sections 19*b*, it is possible to alleviate the stress exerted on the element 101 by dispersing the stress into each of the porous sections 19*b*.

Reference Example 2

Figure 16:
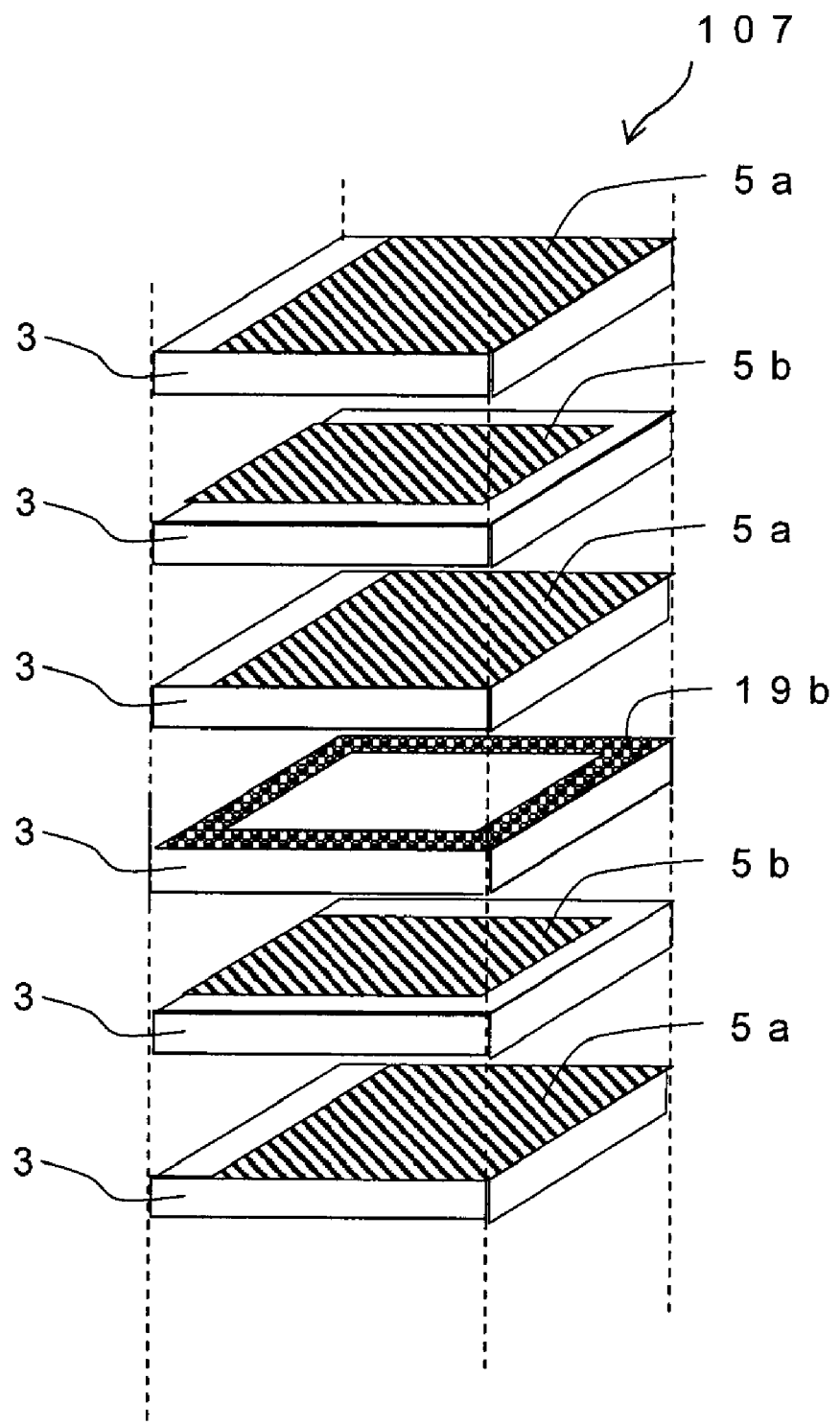
FIG. 16 illustrates an exploded view of a porous section and its vicinity in Reference Example 2 of laminated piezoelectric element.

As shown in FIG. 16, when the porous section 19*b* is disposed in the circumferential part of the top surface of the piezoelectric layer 3 so that it is exposed in the entire area of the lateral surface of the element 101, high stress alleviating effect is obtained regardless of the direction from which the stress is exerted in the lateral surface of the element 101.

Reference Example 3

Figure 17:
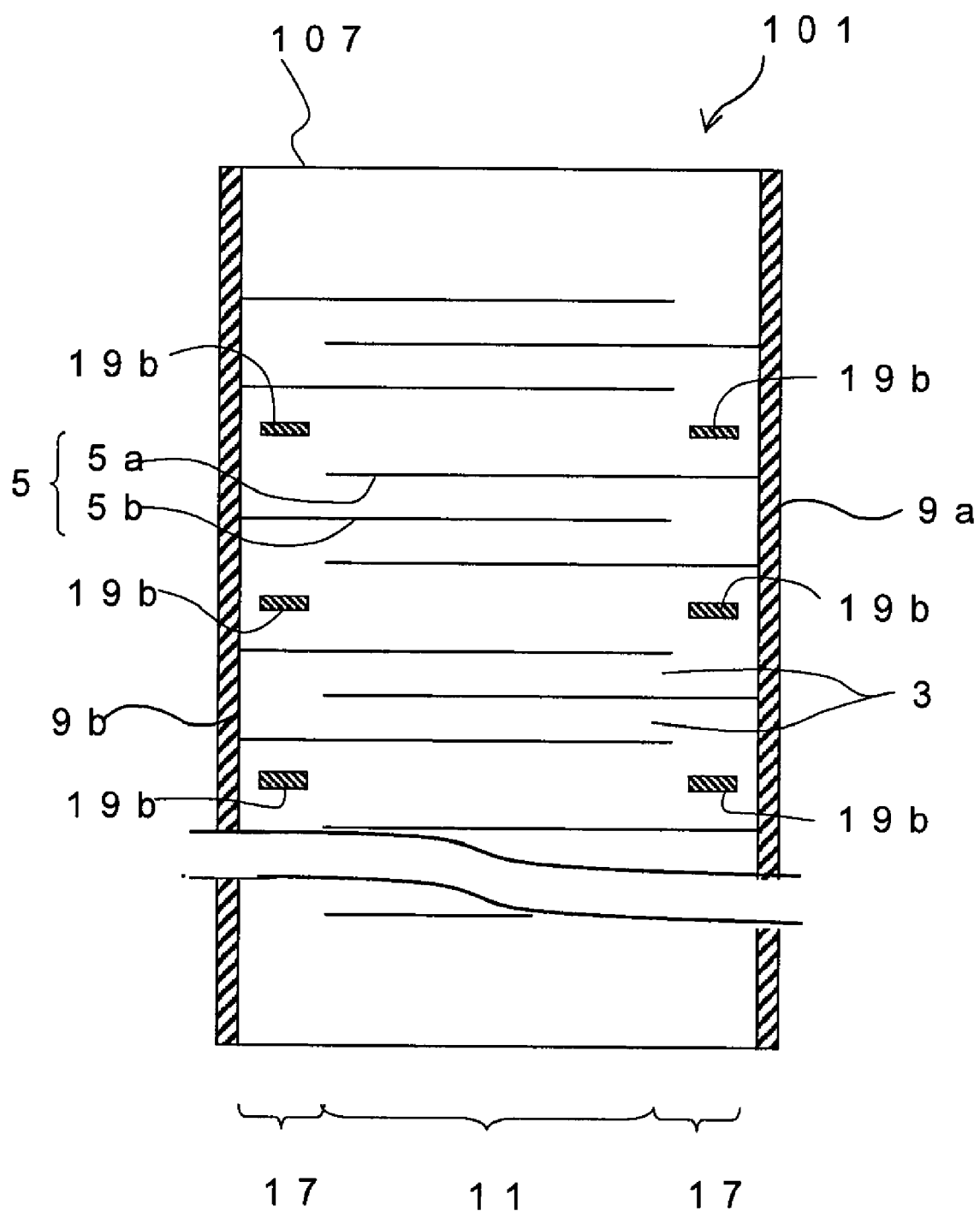
FIG. 17 illustrates a section view of Reference Example 3 of laminated piezoelectric element.

As shown in FIG. 17, when the porous section 19*b* is embedded in the piezoelectric layer 3 so that the porous section 19*b* is not exposed on the lateral surface of the element 101, stress is alleviated by the porous section 19*b*, and dimensional change of the element 1 can be effectively reduced. This is because the percentage at which the porous section 19*b* is exposed on lateral surface of the element 101 is reduced, and thus the strength of the element 101 is improved.

Reference Example 4

Figure 18:
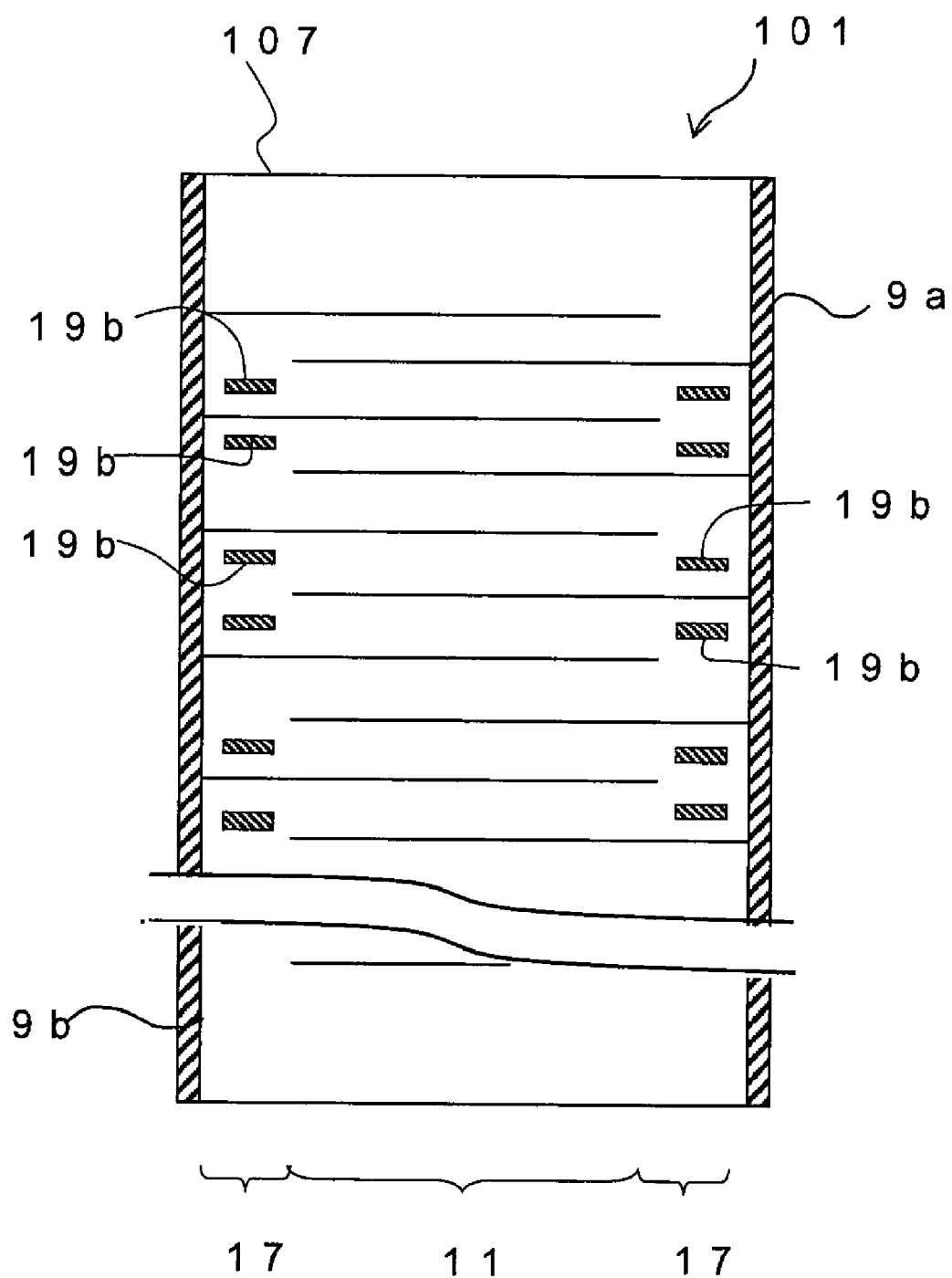
FIG. 18 illustrates a section view of Reference Example 4 of laminated piezoelectric element.

As shown in FIG. 18, the plurality of porous sections 19*b* (two porous sections 19*b* in the case of FIG. 18) may be disposed between the anode-side internal electrode 5*a* and the anode-side internal electrode 5*a* which are adjacent to each other in the laminating direction, or the cathode-side internal electrode 5*b* and the cathode-side internal electrode 5*b* which are adjacent to each other in the laminating direction. By disposing the porous sections 19*b* in this manner, it is possible to further disperse the stress exerted on each of the porous sections 19*b*.

In the above, embodiment of the present invention has been explained, the element of the present invention may be changed in various ways without departing from the scope of the present invention rather than being limited to the embodiment as described above. For example, in the above embodiment, the case where the porous section is formed of alloy was explained, the form wherein a part of porous section may be made of alloy and the remaining porous section may be made of single metal. Also in the above embodiment, explanation was made for the case where the porous section contains the same ingredient, however, the porous section may be made up of two or more kinds of layers having different main ingredients.

The laminated piezoelectric element of the present invention may be suitably used, for example, as a driving element (piezoelectric actuator) mounted on a fuel jetting device of automobile engine, a liquid jetting device of inkjet or the like, a precise positioning device of optical apparatus or the like, or a vibration preventive apparatus; a sensor element mounted on a combustion pressure sensor, knock sensor, acceleration sensor, load sensor, ultrasonic sensor, pressure-sensitive sensor, yaw rate sensor or the like; and a circuit element mounted on a piezoelectric gyro, piezoelectric switch, piezoelectric transformer, or piezoelectric breaker.

<Jetting Device>

Figure 19:
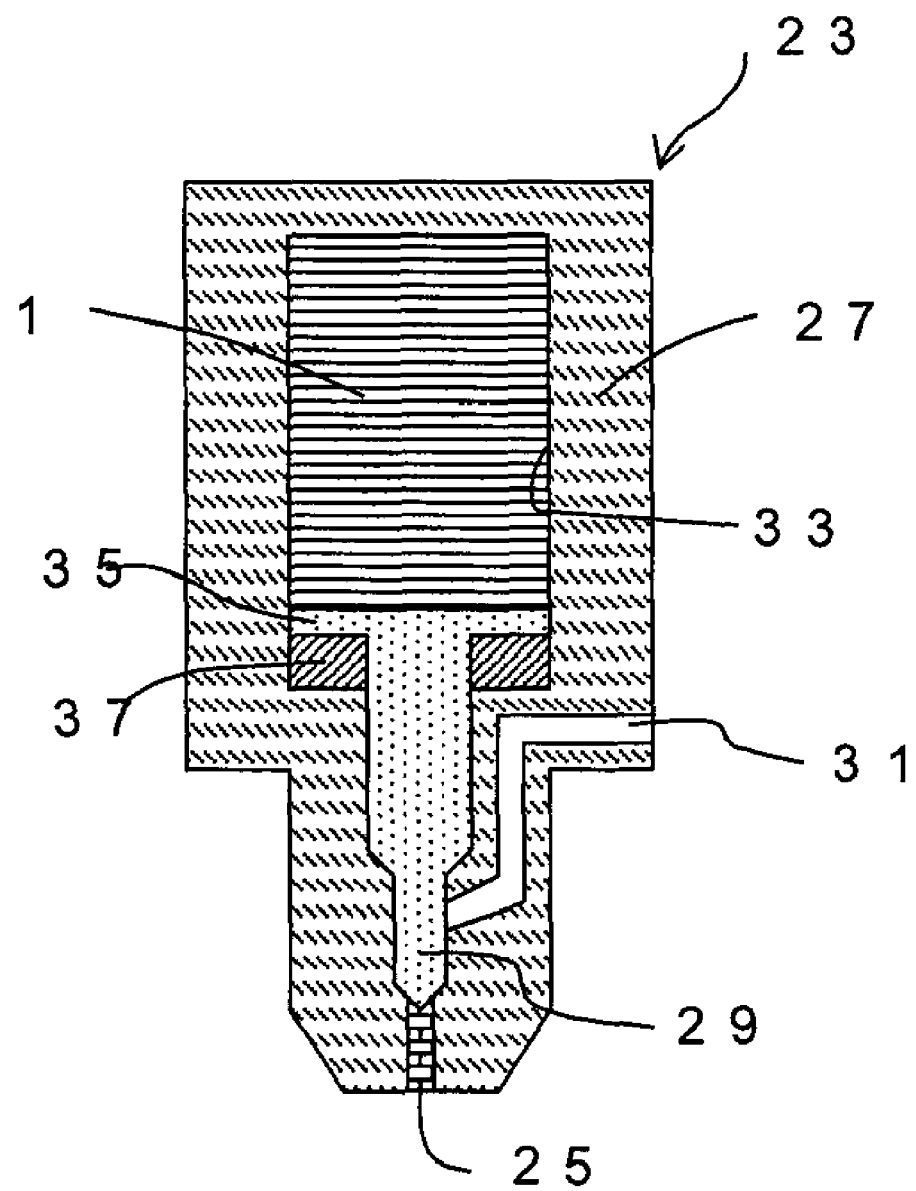
FIG. 19 illustrates a section view of a jetting device according to one embodiment of the present invention.

As shown in FIG. 19, in a jetting device 23 according to the present embodiment, an element of the present invention represented by the forgoing embodiment is accommodated in a storage container 27 having a jet hole 25 in its one end. Inside the storage container 27, a needle valve 29 capable of opening/closing the jet hole 25 is provided. The jet hole 25 is provided with a fuel path 31 in a communicative manner depending on motion of the needle valve 29. This fuel path 31 is connected with an external fuel source, and is constantly supplied with fuel at constant high pressure. Accordingly, in this configuration, when the needle valve 29 opens the jet hole 25, the fuel supplied to the fuel path 31 is jetted inside a combustion room of internal combustion engine which is not illustrated, at constant high pressure.

An upper end of the needle valve 29 has increased inner diameter, and a piston 35 which is slidable with a cylinder 33 formed in the storage container 27 is disposed. And inside the storage container 27, a piezoelectric actuator equipped with the element 1 is accommodated.

In such a jetting device, when the piezoelectric actuator extends upon application of voltage, the piston 35 is pushed, and the needle valve 29 closes the jet hole 25, so that supply of fuel is stopped. Further, when application of voltage is stopped, the piezoelectric actuator contracts, and a disc spring 37 pushes back the piston 35, and the jet hole 25 communicates with the fuel path 31, to jet the fuel.

The jetting device 23 of the present invention may have a container for storing liquid having the jet hole 25, and the element 1, and the liquid inside the container may be discharged through the jet hole 25 upon driving of the element 1. In other words, the element 1 is not necessarily situated inside the container, and it suffices that pressure is applied inside the container by driving of the element. In the present invention, liquid includes various liquid fluids (conductive paste or the like) as well as fuel and ink.

<Fuel Jetting System>

Figure 20:
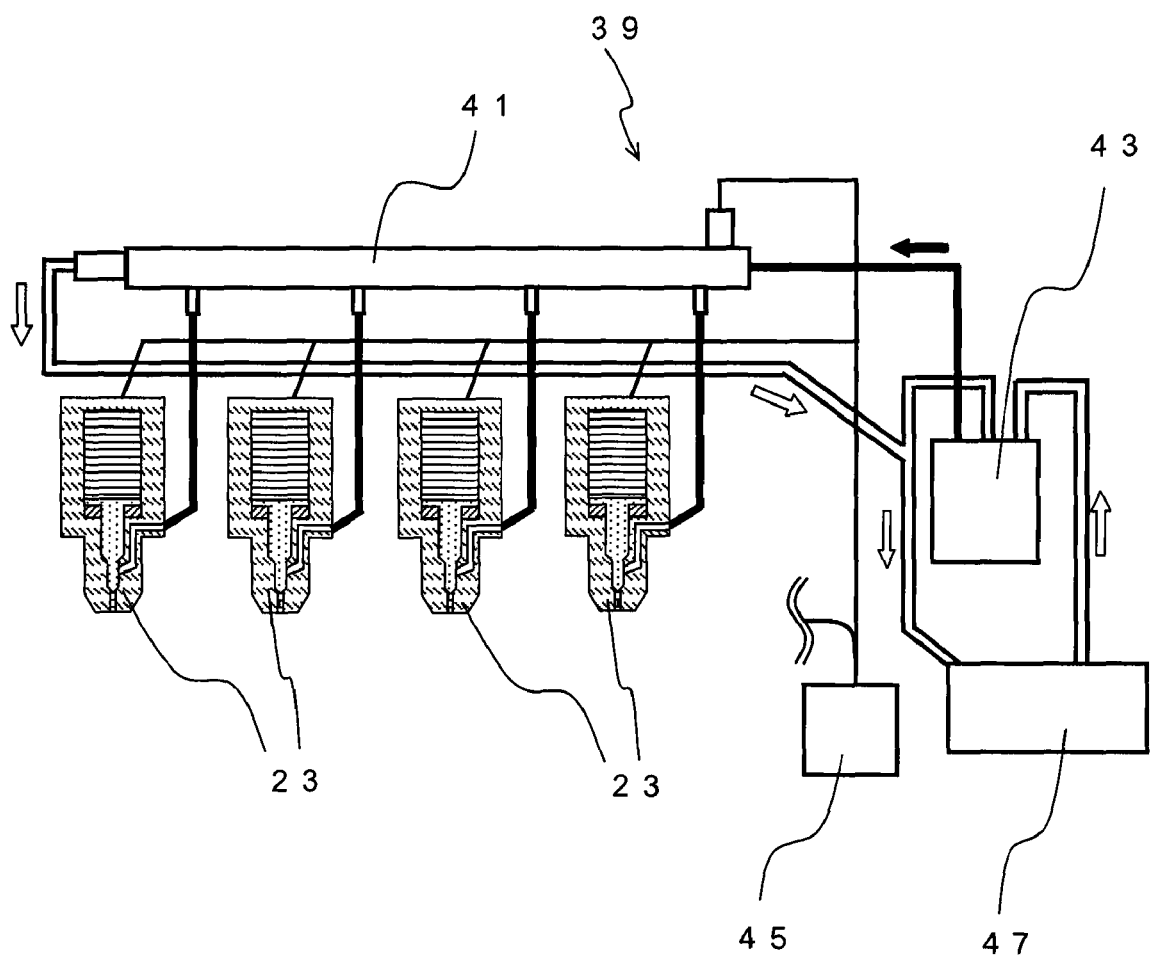
FIG. 20 illustrates a schematic view of a fuel jetting system according to one embodiment of the present invention.

As shown in FIG. 20, a fuel jetting system 39 according to the present embodiment includes a common rail 41 stocking high pressure fuel, a plurality of the jetting devices 23 for jetting the fuel stocked in the common rail 41, a pressure pump 43 for supplying the common rail 41 with high pressure fuel, and a jet controlling unit 45 that supplies the jetting device 23 with a driving signal.

The jet controlling unit 45 controls an amount and timing of fuel jet while sensing the circumstance in the combustion room of engine by means of a sensor or the like. The pressure pump 43 plays a role of feeding fuel from a fuel tank 47 to the common rail 41 while adjusting the pressure of the fuel to about 1000 to 2000 atmospheric pressures, preferably about 1500 to 1700 atmospheric pressures. The common rail 41 stocks the fuel fed from the pressure pump 43 and feeds it to the jetting device 23 appropriately. The jetting device 23 jets a small amount of fuel into the combustion room in a mist form through the jet hole 25 as described above.

Example

A piezoelectric actuator having the element according to the embodiment of the present invention was fabricated in the following manner. First, calcined powder of piezoelectric ceramics consisting mainly of lead zirconate titanate ($PbZrO_3$—$PbTiO_3$) having an average particle size of 0.4 μm, a binder, and a plasticizer were mixed to prepare a slurry. Using this slurry, a plurality of ceramic green sheets which was to become a piezoelectric layer 3 of 150 μm thick were fabricated by doctor blade method.

A plurality of sheets wherein a conductive paste in which a binder is added to silver-palladium alloy (silver 95% by mass-palladium 5% by weight) was formed on either surface of the obtained ceramic green sheet by screen printing method were fabricated. In Sample Nos. 1 to 11 and 13, 300 of these sheets were laminated to obtain a laminated formed body. In Sample Nos. 12 and 14, 10 of these sheets were laminated to obtain a laminated formed body. In the part where the porous section 19 was to be formed, a conductive paste of silver-palladium alloy (silver 99% by mass-palladium 1% by weight) was printed with a varied pattern of screen printing. The obtained laminated formed body was retained at 800° C., sintered at 1050° C., heated and retained at 1000° C. for 1 hour, and then cooled. In each sample, the porous section 19 was disposed in the manner as shown in Table 1.

Next, into a mixture of flake-like silver powder having an average particle size of 2 μm and the remainder of amorphous glass powder consisting mainly of silicon having an average particle size of 2 μm and a softening point of 640° C., 8 parts by mass, relative to 100 parts by mass of total of silver powder and glass powder, of a binder was added, and thoroughly mixed to prepare a silver glass conductive paste. Then this silver glass conductive paste was printed on opposing lateral surfaces of the laminated structure 7 and dried, followed by burning at 700° C. for 30 minutes, to form the external electrodes 9.

Thereafter, a lead wire was connected to the external electrodes 9, a DC electric field of 3 kV/mm was applied to the positive and negative external electrodes 9 for 15 minutes via the lead wire to conduct a polarization treatment, and a piezoelectric actuator using the element 1 of the form as shown in FIG. 1 was fabricated.

DC voltage of 170 V was applied on the obtained element 1, and displacement was observed in the laminating direction in every piezoelectric actuator.

Tests were conducted by applying AC voltage of 0 to +170V at a frequency of 150 Hz on these piezoelectric actuators at room temperature, and driving these continuously up to $1 \times 10^9$ cycles. The results are as shown in Table 1. In the column of durability characteristic of actuator in Table 1, durability was indicated by "⊙ (excellent)", "○ (good)" and "x (disapproval)".

TABLE 1

| No. | Arrangement of porous layer | Number of porous layer in end-side non-opposing section | Number of porous layer in lateral-side non-opposing section | Position of porous layer between internal electrodes in lateral-side non-opposing section | Number of high density layer | Number of laminated internal electrodes | Metal composition in paste of internal electrode and high density layer |
|---|---|---|---|---|---|---|---|
| 1 | FIG. 1 | 2 | 0 | — | 0 | 300 | Silver 90% Pd 10% |
| 2 | FIG. 4 | 4 | 0 | — | 0 | 300 | Silver 90% Pd 10% |
| 3 | FIG. 7 | 2 | 0 | — | 2 | 300 | Silver 90% |

TABLE 1-continued

| No. | Fig | Col3 | Col4 | Layer positions | Col6 | Col7 | Composition |
|---|---|---|---|---|---|---|---|
| 4 | FIG. 8 | 2 | 0 | — | 2 | 300 | Pd 10% Silver 90% |
| 5 | FIG. 5 | 16-split × 2 | 0 | — | 0 | 300 | Pd 10% Silver 90% |
| 6 | FIG. 9 | 16-split × 2 | 0 | — | 2 | 300 | Pd 10% Silver 90% |
| 7 | FIG. 11 | 16-split × 2 | 0 | — | 2 | 300 | Pd 10% Silver 90% |
| 8 | FIG. 14 | 0 | 5 | 50th layer, 100th layer, 150th layer, 200th layer, 250th layer | 0 | 300 | Pd 10% Silver 90% |
| 9 | FIG. 16 | 0 | 5 | 50th layer, 100th layer, 150th layer, 200th layer, 250th layer | 0 | 300 | Silver 90% Pd 10% |
| 10 | FIG. 18 | 0 | 10 | 49th layer, 50th layer, 99th layer, 100th layer, 149th layer, 150th layer, 199th layer, 200th layer, 249th layer, 250th layer | 0 | 300 | Silver 90% Pd 10% |
| 11 | FIG. 13 | 2 | 5 | 50th layer, 100th layer, 150th layer, 200th layer, 250th layer | 0 | 300 | Silver 90% Pd 10% |
| 12 | FIG. 12 | 2 | 0 | — | 0 | 10 | Silver 90% Pd 10% |
| 13 | — | 0 | 0 | — | 0 | 300 | Silver 90% Pd 10% |
| 14 | — | 0 | 0 | — | 0 | 10 | Silver 90% Pd 10% |

| No. | Metal composition in porous layer paste | Metal composition after burning of internal electrode and metal layer | Porosity of internal electrode and high density layer (%) | Metal composition after burning of porous layer | Porosity of porous layer (%) | Displacement in initial state (μm) |
|---|---|---|---|---|---|---|
| 1 | Silver 99% Pd 1% | Silver 91% Pd 9% | 20 | Silver 95% Pd 5% | 85 | 40 |
| 2 | Silver 99% Pd 1% | Silver 91% Pd 9% | 20 | Silver 95% Pd 5% | 85 | 38 |
| 3 | Silver 99% Pd 1% | Silver 91% Pd 9% | 20 | Silver 95% Pd 5% | 85 | 39 |
| 4 | Silver 99% Pd 1% | Silver 91% Pd 9% | 20 | Silver 95% Pd 5% | 85 | 39 |
| 5 | Silver 99% Pd 1% | Silver 91% Pd 9% | 20 | Silver 95% Pd 5% | 85 | 41 |
| 6 | Silver 99% Pd 1% | Silver 91% Pd 9% | 20 | Silver 95% Pd 5% | 85 | 38 |
| 7 | Silver 99% Pd 1% | Silver 91% Pd 9% | 20 | Silver 95% Pd 5% | 85 | 38 |
| 8 | Silver 99% Pd 1% | Silver 91% Pd 9% | 20 | Silver 95% Pd 5% | 85 | 45 |
| 9 | Silver 99% Pd 1% | Silver 91% Pd 9% | 20 | Silver 95% Pd 5% | 85 | 46 |
| 10 | Silver 99% Pd 1% | Silver 91% Pd 9% | 20 | Silver 95% Pd 5% | 85 | 48 |
| 11 | Silver 99% Pd 1% | Silver 91% Pd 9% | 20 | Silver 95% Pd 5% | 85 | 44 |
| 12 | Silver 99% Pd 1% | Silver 91% Pd 9% | 20 | Silver 95% Pd 5% | 85 | 2 |
| 13 | — | Silver 90% Pd 10% | — | — | 85 | 35 |
| 14 | — | Silver 90% Pd 10% | — | — | 85 | 2 |

| No. | Occurrence of noise of harmonic component | Occurrence of beat tone at 1 kHz or higher | Actuator initial characteristic | Displacement after $1 \times 10^9$ cycles (μm) | Peeling in laminated part after continuous driving ($1 \times 10^9$ cycles) | durability characteristic of actuator |
|---|---|---|---|---|---|---|

TABLE 1-continued

| | | | | | | |
|---|---|---|---|---|---|---|
| 1 | Not observed | Not observed | ○ | 35 | Not observed | ○ |
| 2 | Not observed | Not observed | ○ | 35 | Not observed | ○ |
| 3 | Not observed | Not observed | ○ | 36 | Not observed | ○ |
| 4 | Not observed | Not observed | ○ | 36 | Not observed | ○ |
| 5 | Not observed | Not observed | ○ | 38 | Not observed | ○ |
| 6 | Not observed | Not observed | ○ | 38 | Not observed | ⊙ |
| 7 | Not observed | Not observed | ○ | 38 | Not observed | ⊙ |
| 8 | Not observed | Not observed | ○ | 40 | Not observed | ○ |
| 9 | Not observed | Not observed | ○ | 41 | Not observed | ○ |
| 10 | Not observed | Not observed | ○ | 42 | Not observed | ○ |
| 11 | Not observed | Not observed | ○ | 40 | Not observed | ○ |
| 12 | Not observed | Not observed | ○ | 2 | Not observed | ⊙ |
| 13 | Observed | Observed | ○ | 0 | Observed | X |
| 14 | Observed | Observed | ○ | 0 | Observed | X |

As shown in Table 1, in Sample Nos. 13 and 14 wherein a layer capable of alleviating stress is not provided in the non-opposing section, performance was deteriorated at $3\times10^7$ cycles before completion of continuous driving test of predetermined $1\times10^9$ cycles. On the other hand, Sample Nos. 1 to 12 which are examples of the present invention satisfied durability performance after $1\times10^9$ cycles. These samples also exhibited small decrease from initial displacement. In particular, Sample Nos. 6, 7 and 12 had excellent durability rather than exhibiting little change in element performance after $1\times10^9$ cycles.

The invention claimed is:

1. A laminated piezoelectric element, comprising:
a laminated structure comprising:
an opposing section comprising:
a plurality of internal electrodes comprising a plurality of anode side internal electrodes and a plurality of cathode side internal electrodes; and
a plurality of piezoelectric layers alternately laminated with the plurality of internal electrodes, wherein the anode side internal electrodes and the cathode side internal electrodes are located adjacent to each other and oppose each other respectively in a laminating direction; and
at least one non-opposing section comprising at least one porous section having a porosity larger than a porosity of each of the internal electrodes, wherein the at least one porous section comprises a plurality of portions interspersed via voids and at least one site in which the portions contact each other.

2. The laminated piezoelectric element according to claim 1, wherein the at least one non-opposing section comprises an end-side non-opposing section located in a position closer to an end of the laminated structure in the laminating direction than the opposing section, and wherein the end-side non-opposing section comprises the at least one porous section.

3. The laminated piezoelectric element according to claim 2, wherein the end-side non-opposing section further comprises a high density layer having a porosity smaller than a porosity of each of the internal electrodes.

4. The laminated piezoelectric element according to claim 2, wherein the at least one porous section is located closer to the opposing section than an end of the laminated structure in the laminating direction.

5. The laminated piezoelectric element according to claim 1, wherein the at least one non-opposing section comprises a lateral-side non-opposing section located between the opposing section and a lateral surface of the laminated structure, and wherein the lateral-side non-opposing section comprises the at least one porous section.

6. The laminated piezoelectric element according to claim 5, wherein the at least one porous section is located between at least one of the anode side internal electrodes and at least one of the cathode side internal electrodes adjacent in the laminating direction.

7. The laminated piezoelectric element according to claim 1, wherein the at least one porous section is located between at least two piezoelectric layers adjacent to each other in the laminating direction.

8. The laminated piezoelectric element according to claim 1, wherein the portions comprise at least one of the group consisting of: metal and ceramic.

9. The laminated piezoelectric element according to claim 1, wherein the at least one porous section comprises a plurality of split porous sections arranged separately so that they are spaced from each other.

10. The laminated piezoelectric element according to claim 1, wherein the at least one porous section has a porosity of at least about 10% and at most about 95%.

11. The laminated piezoelectric element according to claim 10, wherein the at least one porous section has a porosity of at least about 50% and at most about 90%.

12. The laminated piezoelectric element according to claim 1, further comprising a jetting hole configured to discharge a liquid when the laminated piezoelectric element is driven.

13. The laminated piezoelectric element according to claim 12, further comprising a container configured to store a pressurized liquid.

14. The laminated piezoelectric element according to claim 13, wherein the jetting hole is further configured to spray the pressurized liquid.

15. The laminated piezoelectric element according to claim 14, further comprising a jetting control unit configured to output a driving signal to the laminated structure to control the spray of the pressurized liquid through the jetting hole.

16. The laminated piezoelectric element according to claim 15, further comprising a common rail fuel injection system.

17. The laminated piezoelectric element according to claim 1, wherein a length of the laminated structure in a laminating direction is smaller than a length of the laminated structure in a direction perpendicular to the laminating direction.

18. A laminated piezoelectric element, comprising:
   an opposing section comprising:
      a plurality of internal electrodes comprising a plurality of anode side internal electrodes and a plurality of cathode side internal electrodes; and
      a plurality of piezoelectric layers alternately laminated with the plurality of internal electrodes, wherein the anode side internal electrodes and the cathode side internal electrodes are located adjacent to each other and oppose each other respectively in a laminating direction; and
   at least one non-opposing section comprising at least one porous section means operable to reduce deterioration of the laminated piezoelectric element, wherein the at least one porous section comprises a plurality of portions interspersed via voids and at least one site in which the portions contact each other.

19. A displacement characteristic stabilization method for a laminated piezoelectric element, the method comprising:
   forming an opposing section comprising:
      a plurality of internal electrodes comprising a plurality of anode side internal electrodes and a plurality of cathode side internal electrodes; and
      a plurality of piezoelectric layers alternately laminated with the plurality of internal electrodes, wherein the anode side internal electrodes and the cathode side internal electrodes are located adjacent to each other and oppose each other respectively in the laminating direction; and
   forming at least one non-opposing section comprising at least one porous section having a porosity larger than a porosity of each of the internal electrodes, wherein the at least one porous section comprises a plurality of portions interspersed via voids and at least one site in which the portions contact each other.

* * * * *